(12) United States Patent
Frank et al.

(10) Patent No.: US 10,578,881 B2
(45) Date of Patent: Mar. 3, 2020

(54) ILLUMINATION OPTICAL UNIT FOR A METROLOGY SYSTEM AND METROLOGY SYSTEM COMPRISING SUCH AN ILLUMINATION OPTICAL UNIT

(71) Applicants: Carl Zeiss AG, Oberkochen (DE); Carl Zeiss SMT GmbH, Oberkochen (DE)

(72) Inventors: Thomas Frank, Saalfeld (DE); Dirk Doering, Erfurt-Hochheim (DE); Holger Seitz, Jena (DE); Mario Laengle, Jena (DE); Ulrich Matejka, Jena (DE)

(73) Assignees: Carl Zeiss AG, Oberkochen (DE); Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/220,212

(22) Filed: Dec. 14, 2018

(65) Prior Publication Data

US 2019/0121145 A1    Apr. 25, 2019

Related U.S. Application Data

(62) Division of application No. 15/895,210, filed on Feb. 13, 2018, now Pat. No. 10,168,539, which is a
(Continued)

(30) Foreign Application Priority Data

Jun. 28, 2013    (DE) .................. 10 2013 212 613

(51) Int. Cl.
*G02B 27/09*    (2006.01)
*G02B 26/08*    (2006.01)
*G03F 1/84*    (2012.01)

(52) U.S. Cl.
CPC ..... *G02B 27/0961* (2013.01); *G02B 26/0833* (2013.01); *G02B 27/0905* (2013.01); *G03F 1/84* (2013.01)

(58) Field of Classification Search
CPC ............ G02B 27/0961; G02B 27/0905; G02B 26/0833; G03F 1/84
See application file for complete search history.

(56) References Cited

U.S. PATENT DOCUMENTS 4,256,362 A * 3/1981 Bardos .................... G03H 1/16
359/29
6,665,052 B2    12/2003 Sato
(Continued)

FOREIGN PATENT DOCUMENTS

DE        10220815        11/2003
DE       102004011746       9/2005
(Continued)

OTHER PUBLICATIONS

German Examination Report for German Application No. 10 2013 212 613.1 dated Mar. 26, 2014.
(Continued)

*Primary Examiner* — Sang H Nguyen
(74) *Attorney, Agent, or Firm* — Fish & Richardson P.C.

(57) ABSTRACT

An illumination optical unit serves for illuminating objects to be examined by a metrology system. The illumination optical unit has an optical pupil shaping assembly for generating a defined distribution of illumination angles of illumination light over an object field in which an object to be examined can be arranged. An optical field shaping assembly for generating a defined intensity distribution of the illumination light over the object field is disposed downstream of the pupil shaping assembly in the beam path of the illumination light. The field shaping assembly has at least one optical field shaping element arranged in the region of a pupil plane of the illumination optical unit. This results in an illumination optical unit which ensures an illumination which can be set in a defined manner with regard to an
(Continued)

intensity distribution and an illumination angle distribution over the entire object field.

20 Claims, 22 Drawing Sheets

Related U.S. Application Data division of application No. 14/311,420, filed on Jun. 23, 2014, now Pat. No. 9,904,060.

(56) References Cited

U.S. PATENT DOCUMENTS

| | | | |
|---|---|---|---|
| 6,864,960 B2 | 3/2005 | Koehler et al. | |
| 8,094,290 B2 | 1/2012 | Owa et al. | |
| 8,144,308 B2 | 3/2012 | Muramatsu | |
| 9,110,225 B2 | 8/2015 | Mann et al. | |
| 9,904,060 B2 | 2/2018 | Frank et al. | |
| 10,168,539 B2 | 1/2019 | Frank et al. | |
| 2001/0019625 A1 | 9/2001 | Kenan et al. | |
| 2001/0030739 A1 | 10/2001 | Hase et al. | |
| 2003/0012333 A1 | 1/2003 | Schultz et al. | |
| 2003/0095622 A1 | 5/2003 | Schultz et al. | |
| 2004/0184019 A1 | 9/2004 | Totzeck et al. | |
| 2006/0028706 A1 | 2/2006 | Totzeck et al. | |
| 2006/0050261 A1 | 3/2006 | Brotsack | |
| 2007/0165202 A1 | 7/2007 | Koehler et al. | |
| 2008/0278704 A1 | 11/2008 | Endres et al. | |
| 2009/0002664 A1 | 1/2009 | Tanitsu | |
| 2009/0053618 A1* | 2/2009 | Goehnermeier | G03F 7/701 430/5 |
| 2009/0073410 A1 | 3/2009 | Mann et al. | |
| 2010/0039629 A1* | 2/2010 | Xalter | G02B 26/0833 355/67 |
| 2010/0283984 A1 | 11/2010 | Layh et al. | |
| 2011/0001947 A1* | 1/2011 | Dinger | G02B 26/06 355/67 |
| 2011/0019258 A1* | 1/2011 | Levola | G02B 6/0035 359/238 |
| 2011/0102758 A1 | 5/2011 | Schwab et al. | |
| 2011/0188017 A1* | 8/2011 | Horn | G02B 26/0841 355/67 |
| 2012/0092669 A1 | 4/2012 | Fiolka et al. | |
| 2012/0178028 A1 | 7/2012 | Tanitsu | |
| 2012/0212722 A1* | 8/2012 | Smith | G03F 7/7055 355/67 |
| 2012/0236284 A1 | 9/2012 | Tanaka | |
| 2012/0249989 A1 | 10/2012 | Fuji | |
| 2013/0016362 A1* | 1/2013 | Gong | G01B 11/2527 356/610 |
| 2013/0083306 A1 | 4/2013 | Smirnov et al. | |
| 2013/0169966 A1 | 7/2013 | Shchegrov et al. | |
| 2014/0184019 A1 | 7/2014 | Yamato | |
| 2014/0218708 A1* | 8/2014 | Werber | G03F 7/70058 355/67 |
| 2015/0001408 A1 | 1/2015 | Frank et al. | |
| 2015/0241361 A1* | 8/2015 | Urano | G01N 21/9501 356/237.5 |
| 2015/0346604 A1* | 12/2015 | Maul | G02B 19/0095 355/71 |

FOREIGN PATENT DOCUMENTS

| | | |
|---|---|---|
| DE | 102011084255 | 5/2012 |
| DE | 102011082481 | 12/2012 |
| WO | WO 2003/096356 | 11/2003 |
| WO | WO 2005/045503 | 5/2005 |
| WO | WO 2011/144389 | 11/2011 |
| WO | WO 2013/055906 | 4/2013 |

OTHER PUBLICATIONS

J. Heber et al., "Contrast properties of spatial light modulators for microlithography," Proc. of SPIE vol. 6730 673035-1-673035-10.

Taiwan Office Action for Taiwan Application No. 103122056 dated Nov. 17, 2016.

Taiwan Office Action for Taiwan Patent Application No. 103 122 056 dated May 25, 2017, with English Translation.

* cited by examiner

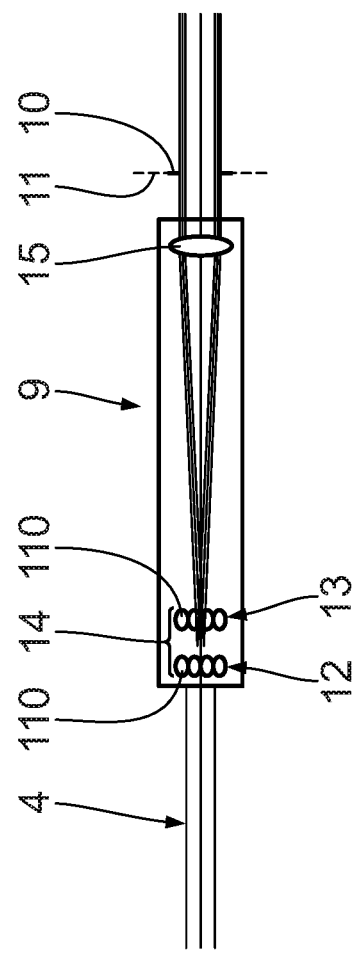
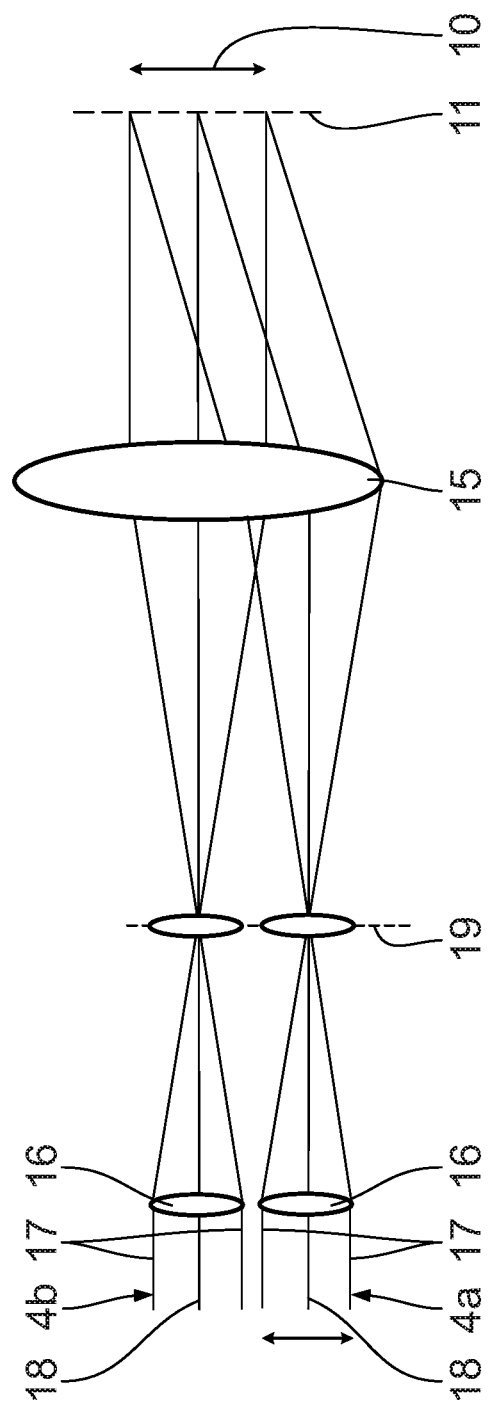
Fig. 2
Fig. 3

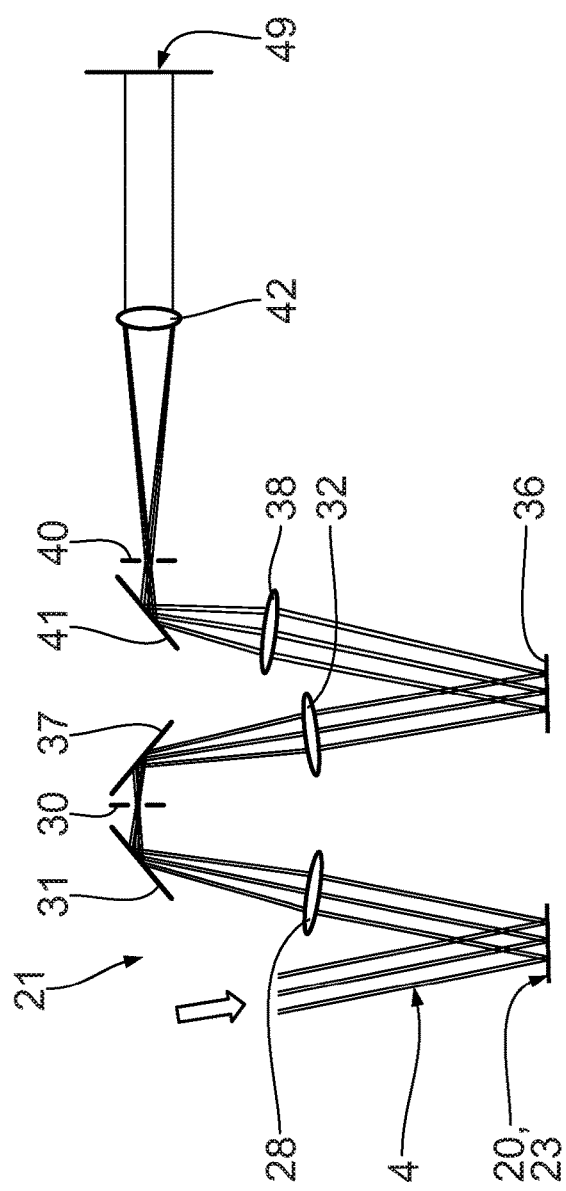
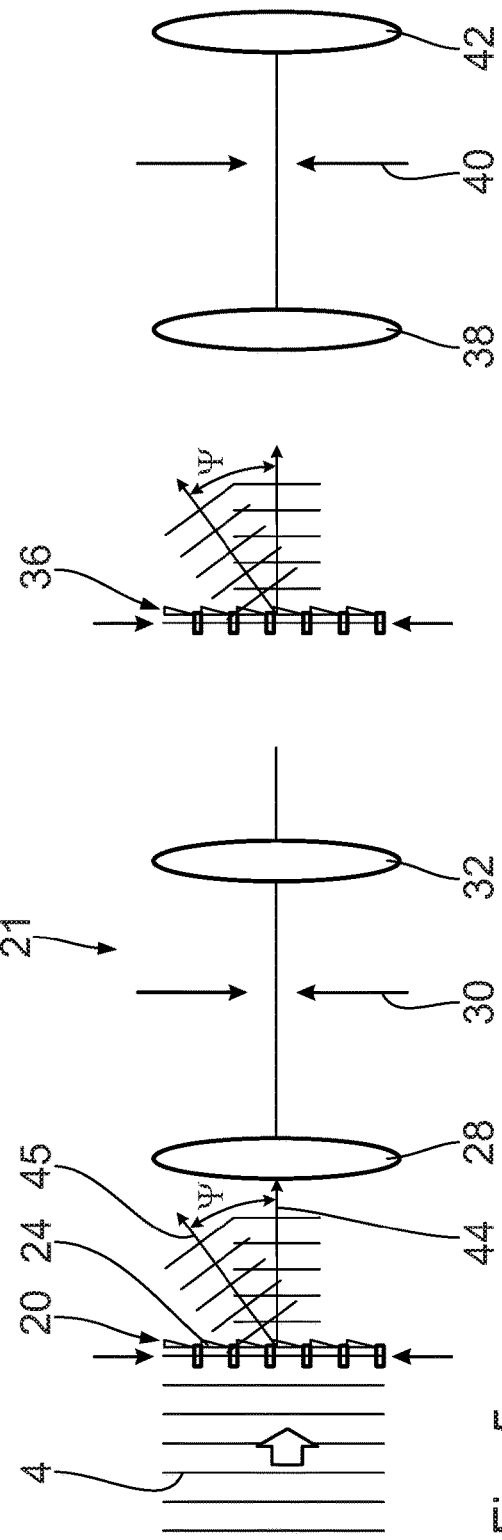

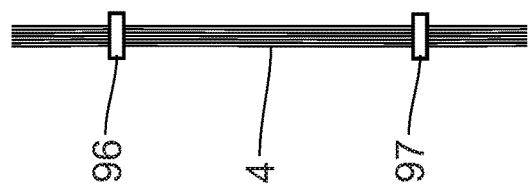
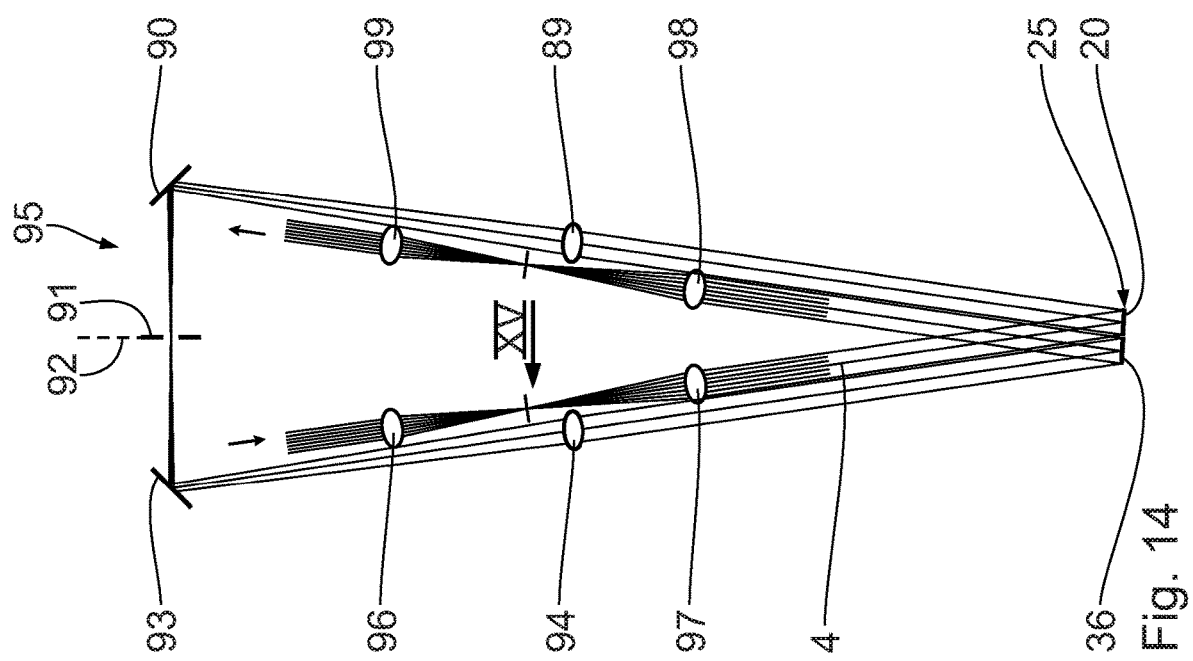

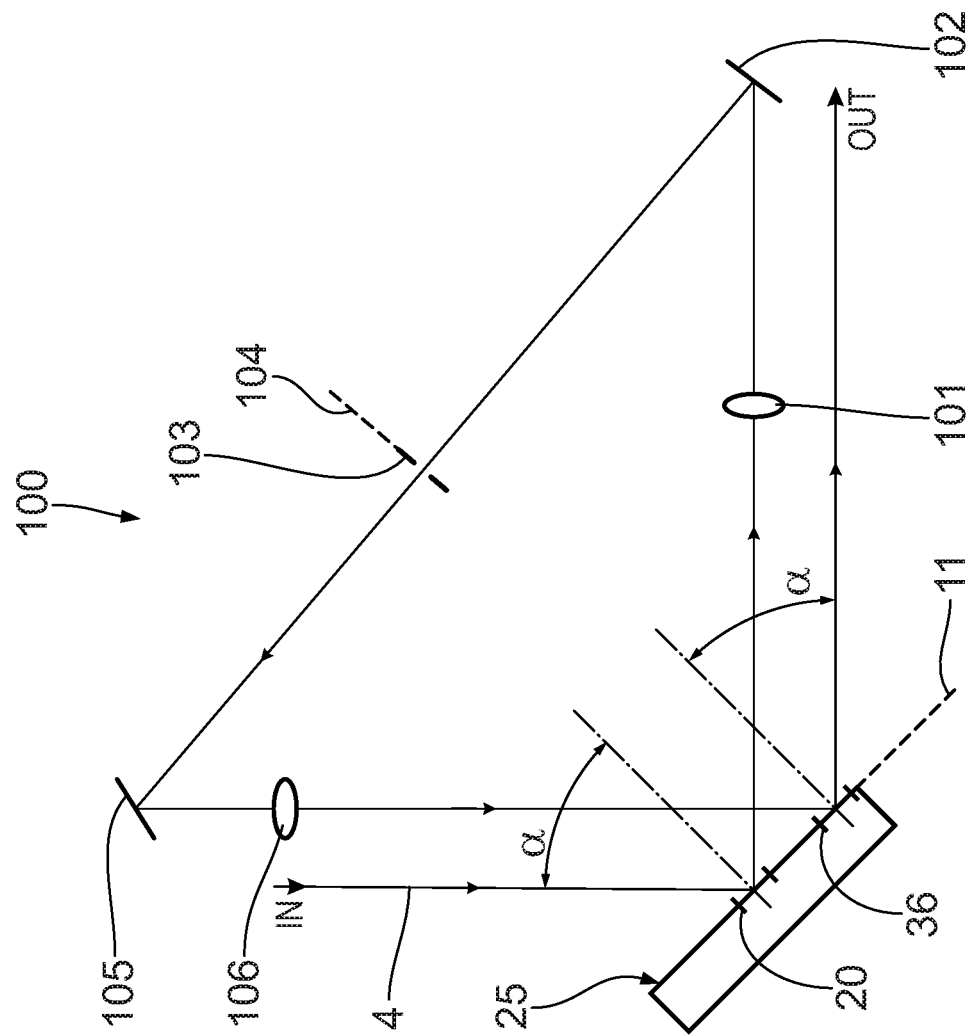
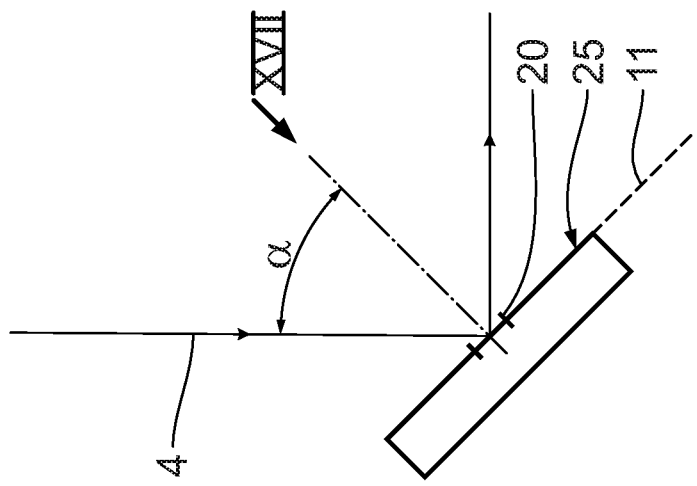
Fig. 16
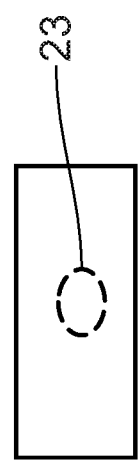
Fig. 17
Fig. 18

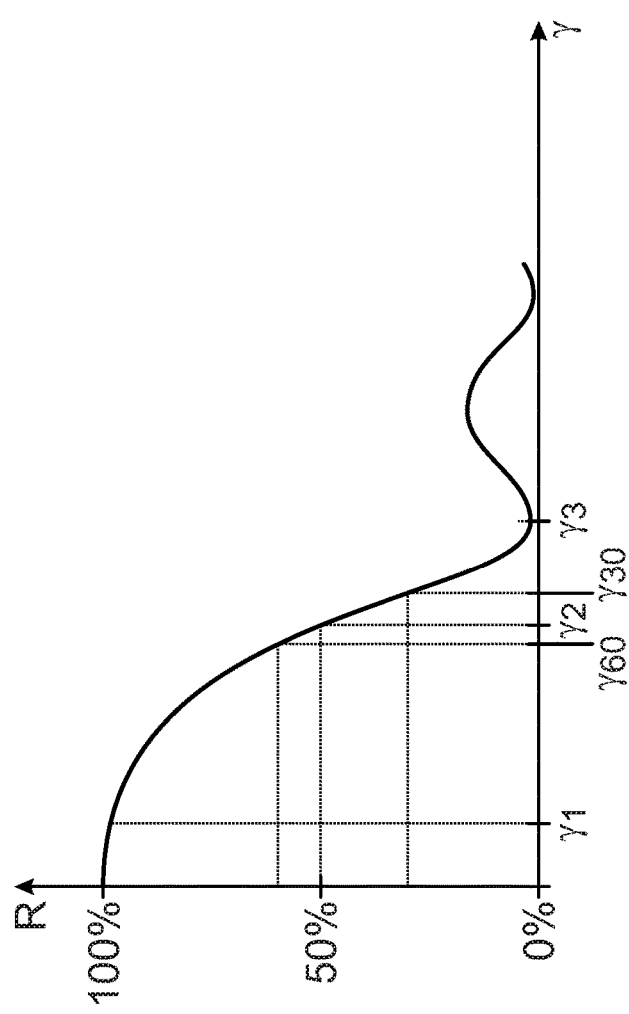
Fig. 38
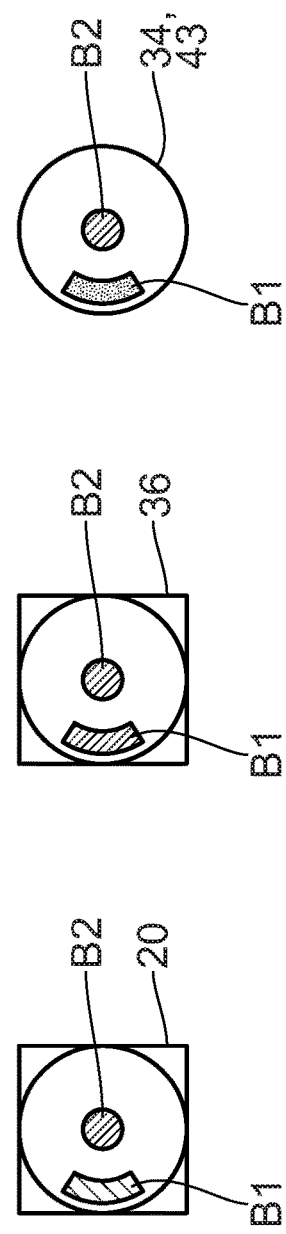
Fig. 39
Fig. 40
Fig. 41

ILLUMINATION OPTICAL UNIT FOR A METROLOGY SYSTEM AND METROLOGY SYSTEM COMPRISING SUCH AN ILLUMINATION OPTICAL UNIT

CROSS-REFERENCE TO RELATED APPLICATIONS

This application is a divisional of and claims priority to U.S. patent application Ser. No. 15/895,210, filed on Feb. 13, 2018, which is a divisional of U.S. patent application Ser. No. 14/311,420, filed on Jun. 23, 2014, now U.S. Pat. No. 9,904,060, which claims priority to German patent application DE 10 2013 212 613.1, filed on Jun. 28, 2013. The contents of each of the above applications are incorporated by reference in their entirety.

TECHNICAL FIELD

The invention relates to an illumination optical unit for illuminating objects to be examined by a metrology system. Furthermore, the invention relates to a metrology system including such an illumination optical unit.

BACKGROUND

Illumination optical units for metrology systems are known for example from DE 10 2011 084 255 A1, WO 2011/144 389 A1, WO 03/096 356 A2 and DE 102 20 815 A1. A mask inspection system including an illumination optical unit is furthermore known from WO 2005/045 503 A1. Illumination optical units for projection exposure apparatuses are known from US 2012/0 236 284 A1, U.S. Pat. Nos. 8,094,290 B2, 8,144,308 B2 and US 2012/0 249 989 A1.

SUMMARY

A problem addressed by the present invention is that of developing an illumination optical unit for illuminating objects to be examined by a metrology system in such a way that an illumination which can be set in a defined manner with regard to an intensity distribution and an illumination angle distribution over the entire object field is ensured.

This problem is solved according to the invention by an illumination optical unit that includes an optical pupil shaping assembly for generating a defined distribution of illumination angles of illumination light over an object field in which an object to be examined can be arranged, an optical field shaping assembly disposed downstream of the pupil shaping assembly in the beam path of the illumination light and serving for generating a defined intensity distribution of the illumination light over the object field, in which the field shaping assembly includes at least one optical field shaping element arranged in the region of a pupil plane of the illumination optical unit.

The field shaping assembly disposed downstream of the pupil shaping assembly in the beam path of the illumination light and including a field shaping element, arranged in the region of a pupil plane of the illumination optical unit, enables not only a defined pupil shaping, that is to say a defined stipulation of an illumination angle distribution over the object field, but also a defined field shaping with the aid of the illumination optical unit. The field shaping by the field shaping element in the region of the pupil plane takes place by a defined generation of deflection angles by the field shaping element in the region of the pupil plane, which leads to a correspondingly defined stipulation of an intensity distribution over the object field.

A diffusing or scattering plate as field shaping element can be embodied as transmissive, but alternatively also as reflective. The field shaping assembly can include more than one diffusing plate for field shaping. A plurality of diffusing plates can be used successively in the beam path of the illumination light. As an alternative or in addition to at least one diffusing plate, a fly's eye condenser or a rod that guides the illumination light can be used for field shaping. Examples of the use of a fly's eye condenser, on the one hand, and of a rod, on the other hand, in the context of an illumination optical unit for a metrology system or for a projection exposure apparatus are known from the prior art. A fly's eye condenser or a rod can be used in particular as a field homogenizing element for field homogenizing, that is to say for making an illumination intensity more uniform over the object field.

A field shaping element can be rotatable in a driven manner about an axis, in which the angle of the axis of rotation with respect to the beam path of the illumination light in the region of the field shaping element is less than 30°. In this case, use is additionally made of a temporal averaging effect in the deflection angle generation at the field shaping element, which brings about an additional homogenization. The axis of rotation can run parallel to the beam path in the region of the field shaping element driven in a rotatable fashion. With the use of a rotatable field shaping element, in addition it is also possible to use at least one static field shaping element in the field shaping assembly. A plurality of rotatable field shaping elements and/or field shaping elements which are displaceable in other degrees of freedom can also be used in the field shaping assembly.

A depolarizer can be placed in the beam path of the illumination light upstream of the pupil shaping assembly. This can be advantageous for example for the light mixing of the illumination light.

A pupil homogenizing assembly can be placed in the beam path of the illumination light upstream of the pupil shaping assembly for generating a defined intensity distribution of the illumination light over a pupil of the illumination optical unit. The pupil homogenizing assembly can support the function of the pupil shaping assembly. In the case of the pupil homogenizing, it is possible to generate a uniform illumination light intensity over a pupil of the illumination optical unit.

In the case of the field or pupil homogenizing, generally a variation of an illumination intensity over a field or pupil region is set which, over defined field or respectively pupil regions, is lower than a stipulated limit, for example $I_{max}-I_{min} \leq 0.01 \cdot I_0$, in which $I_0$ represents an average intensity impingement over the stipulated field or pupil region. A depolarizer of the illumination optical unit can be arranged upstream of the pupil homogenizing assembly. The pupil homogenizing assembly can be embodied as at least one multilens array or as a fly's eye condenser. In this case, a total beam of the illumination light which is incident on the pupil homogenizing assembly is split into partial beams which respectively impinge on the individual microlenses and which are superimposed on one another for light mixing in a downstream plane.

The pupil shaping assembly can include at least one micromirror array (MMA), which enables a defined stipulation of a pupil shaping.

The MMA can be a diffraction-reflection grating for the illumination light, which enables a pupil shaping with advantageously good suppression of illumination light which is not intended to contribute to the object field illumination. This illumination light to be suppressed is diffracted in orders of diffraction that are not used for the further illumination. By use of their tilting position, the micromirrors of the MMA embodied as a diffraction-reflection grating set an angle of reflection of the illumination light from the MMA, in which the illumination light is used whose angle of reflection is equal to the diffraction angle of a used order of diffraction of the diffraction-reflection grating. In so far as the angle of reflection corresponds exactly to the diffraction angle of the used order of diffraction, a blaze tilting position of the respective micromirrors of the MMA is attained. The desired used order of diffraction downstream of the diffraction-reflection grating can be effected by a spatial filter stop which transmits, for example, exactly the desired used order of diffraction or a plurality of desired used orders of diffraction.

A design of the beam path of the illumination light onto the at least one MMA can be configured in such a way that the illumination light is incident on micromirrors of the MMA with an input divergence that is less than a diffraction angle of a first order of diffraction of the diffraction-reflection grating formed by the MMA. This avoids an undesired crosstalk between different orders of diffraction of the reflection grating.

With micromirrors which can be continuously adjusted within a tilting angle range, it is possible to set, for example, illumination light grey levels in the pupil by an approximation of an angle of reflection of the respective micromirrors to a blaze angle.

The MMA can include micromirrors that can be switched discretely between two tilting angles. In the case of an alternative switching of the micromirrors between two tilting angles, the tilting positions which correspond to these two tilting angles can be end stops of a tilting adjusting travel of the micromirrors. A corresponding embodiment of the micromirrors is simple in terms of production engineering.

A design of the beam path of the illumination light onto the at least one MMA can be configured in such a way that the illumination light is incident on a micromirror principal plane of the MMA with an angle of incidence which is greater than 0°. The design of the beam path with an angle of incidence on the micromirror principal plane of greater than 0° allows a spatial separation of the beam path of the illumination light which is incident on the MMA from the beam path of the illumination light which is reflected by the MMA. The angle of incidence of the micromirrors on the micromirror principal plane can be greater than 5°, can be greater than 10°, can be greater than 15° and can be in the region of 20°, for example.

The pupil shaping assembly can include at least one spatial filter stop. The at least one spatial filter stop leads to a reliable selection of the illumination light that is to be used further. The at least one spatial filter stop can be arranged downstream of at least one MMA of the pupil shaping assembly in the beam path of the illumination light.

A field stop can be placed in the beam path downstream of the field shaping assembly. This enables a defined shaping of an outer field boundary of the object field.

At least one optical relay assembly can be placed in the beam path downstream of the field shaping assembly for the imaging generation of at least one further pupil plane in the beam path downstream of the pupil plane in which the field shaping element is arranged. This makes it possible to generate at least one further pupil plane of the illumination optical unit, which can be used for beam monitoring and/or for beam shaping.

A tube lens can be placed in the beam path of the illumination light downstream of the field shaping assembly. This enables an optical monitoring, in particular a visual monitoring, of the beam path.

A condenser lens can be placed in the beam path of the illumination light between the tube lens and the object field. This enables the illumination light to be guided effectively toward the object field.

A further problem addressed by the invention is that of developing an illumination optical unit of the type mentioned in the introduction in such a way that a pupil homogenization of the illumination optical unit that is as precise as possible is achieved.

This problem is solved according to the invention by an illumination optical unit that includes an optical pupil homogenizing assembly for generating a defined intensity distribution of the illumination light over a pupil of the illumination optical unit, in which the pupil homogenizing assembly includes at least one micromirror array.

The explanations already given above are applicable with regard to the pupil homogenization, that is to say the stipulation of a maximum desired variation. The pupil homogenizing assembly also makes it possible to achieve a correction or a compensation of a homogenization result of a further pupil homogenizing assembly or of a pupil shaping assembly in the beam path of the illumination light. As a further pupil homogenizing assembly it is possible to use, for example, a multilens array or a fly's eye condenser in particular in the beam path of the illumination light upstream of the MMA pupil homogenizing assembly.

An illumination light irradiance on the at least one MMA can be reduced, for example by expanding an illumination light beam incident on the MMA with the aid of a telescope and/or with the aid of an increased angle of incidence on the MMA. A reduction of the illumination light irradiance on the MMA can also be achieved by preshaping a beam of the illumination light that is incident on the MMA with the aid of a microlens array and/or a fly's eye condenser having non-round, for example elliptic or hexagonally stretched, microlenses.

In some implementations, the illumination optical unit can be developed with all individual features and/or feature combinations which have already been discussed above in connection with the illumination optical unit and the metrology system.

A further problem addressed by the invention is that of developing an illumination optical unit of the type mentioned in the introduction in such a way that it is possible to set a stipulated intensity distribution over a pupil of the illumination optical unit with the highest possible suppression of stray light.

This problem is solved according to the invention by use of an illumination optical unit that includes an optical pupil influencing assembly for influencing an intensity distribution of the illumination light over a pupil of the illumination optical unit, in which the pupil influencing assembly is designed such that the illumination light impinges on at least one region of a micromirror array at least twice in the beam path of the illumination light one after the other.

The impingement on at least one MMA twice one after another in the beam path of the illumination light leads to a particularly good suppression of stray light. In this case, one and the same MMA region of the MMA can be impinged on twice one after another. Alternatively, MMA regions that are separated from one another, for example, can be impinged on in each case once one after another, such that impingement twice on at least one MMA region, namely on two MMA regions, is likewise effected. The pupil influencing achieved by the pupil influencing assembly can be a pupil homogenization or a pupil shaping corresponding to what has already been explained above. A beam guiding of the illumination light in the region of the multiple impingement on the at least one MMA region can be embodied in a folded and compact fashion. Structural space conflicts possibly occurring between optical components arranged along this folded beam path can be resolved by an axial offset of originally closely adjacent optical components such that a sufficient axial distance between the optical components results. In so far as lenses, in particular condenser lenses, are offset axially in order to resolve structural space conflicts, the optical design can be correspondingly adapted, for example by adaptation of at least one lens focal length.

The pupil influencing assembly can include at least two MMA regions that are separated from one another and are arranged one after another in the beam path of the illumination light. MMA regions that are separated from one another enable a corresponding, spatially separated beam guiding of the illumination light. Alternatively or additionally, the illumination light can impinge on one and the same MMA region twice in succession. The MMA regions that are separated from one another can constitute regions on one and the same MMA, but can, in principle, also be realized by two micromirror arrays spatially separated from one another. Impingement on more than two MMA regions one after another for further improved suppression of stray light is also possible.

A design of the beam path of the illumination light onto the at least one MMA and a design of the at least one MMA can be configured in such a way that the illumination light upon a first micromirror impingement is reflected by micromirrors of the MMA whose tilting angle driving is effected in a first tilting angle operating point range, that the illumination light upon a second micromirror impingement is reflected by micromirrors of the MMA whose tilting angle driving is effected in a second tilting angle operating point range, in which the first tilting angle operating point range differs from the second tilting angle operating point range. For example, different tilting angle operating point ranges of the micromirrors can be used. In this case, a first group of micromirrors can be operated in the first used angle range and a second group of micromirrors can be operated in the second tilting angle operating point range. This can be used in particular for setting grey levels by use of a targeted deviation of an illumination light angle of reflection of the micromirrors from a blaze angle of the diffraction-reflection grating. More than two tilting angle operating point ranges can also be used as a result of a corresponding assignment of different micromirror groups. In an alternative design of the illumination optical unit, the first tilting angle operating point range can also be identical to the second tilting angle operating point range. At least one of the tilting angle operating point ranges or all of the tilting angle operating point ranges can lie in the range of a global intensity maximum of the reflectivity at the respective micromirror or in the range of a global reflectivity minimum of the reflectivity of the respective micromirrors. The different micromirror impingements can take place on one and the same MMA or else on different MMAs.

In some implementations, a design of the beam path of the illumination light onto the at least one MMA can be configured in such a way that the illumination light upon a first micromirror impingement is reflected with a first reflectivity range by micromirrors of the MMA, that the illumination light upon a second micromirror impingement is reflected with at least one second reflectivity range by micromirrors of the MMA, in which the first reflectivity range differs from the second reflectivity range. For example, at least one of the reflectivity ranges can cover a reflectivity in the range of between 30% and 60%. Advantages of these designs can include the following. The first reflection range can lie for example in the range of between 0% and 30% reflection. The second reflection range can lie for example in the range of between 60% and 100%. A further reflection range can lie for example in the range of between 30% and 60%. A stipulation of more than two reflectivity ranges which are used is also possible. Alternatively, a design of the illumination optical unit is possible in which the first reflectivity range and the second reflectivity range are identical.

In so far as the illumination light impinges sequentially multiply on at least one MMA region, the illumination optical unit can be designed such that use is made of exactly one micromirror impingement with a used angle range with low reflection, for example between 0% and 30%, and/or exactly one used angle range with great dependence of the reflection of the associated micromirrors on the tilting angle adjustment thereof. In all other micromirror impingements, higher reflections and/or lesser dependences of the reflection on the tilting angle adjustment are then present. This can be used for optimizing a setting of grey levels, that is to say of total reflectivities to be stipulated exactly for specific illumination channels.

The angles of incidence of the illumination light on the micromirror principal plane of the MMA can in turn be greater than 0°, can be greater than 5°, can be greater than 10°, can be greater than 15°, and can be in the region of 20°, for example. Average angles of incidence in the two angle-of-incidence ranges can differ from one another by more than 3°, by more than 5°, or even by more than 10°. It is also possible to assign the micromirrors to more than two angle-of-incidence ranges that are used. Alternatively, the first range of angles of incidence can also be identical to the second range of angles of incidence.

The features discussed above can be combined with the individual features or with the feature combinations which have already been discussed in connection with the illumination optical unit and the metrology system. The choice of tilting angle operating point ranges explained above can relate to micromirror groups, in particular to entire micromirror regions, but also to individual micromirrors. In principle, each micromirror of the MMA can be operated with an individual deflection and fundamentally also with an individual operating point.

A further problem addressed by the invention is that of developing an illumination optical unit of the type mentioned in the introduction in such a way that a pupil influencing takes place as precisely as possible.

This problem is solved according to the invention by an illumination optical unit that includes an optical pupil influencing assembly for influencing an intensity distribution of the illumination light over a pupil of the illumination optical unit, in which the pupil influencing assembly includes at least one MMA, the at least one MMA for pupil influencing is embodied as a diffraction-reflection grating for the illumination light, and the at least one MMA is driven in such a way that it is operated in the at least second used order of diffraction for the illumination light.

Operation of the at least one MMA in the second used order of diffraction for the illumination light leads to particularly good suppression of stray light. The second order of diffraction of the illumination light at the MMA is therefore chosen for further use. The pupil influencing can be a pupil homogenization and/or a pupil shaping. The advantages of a reflection grating embodiment of the MMA have already been explained above.

In the case of an alternative driving of the MMA, selected micromirrors of the MMA are operated in the at least second used order of diffraction for the illumination light. In this case, at least one micromirror of the MMA can be operated in the at least second used order of diffraction.

The features discussed above can be combined with the individual features or with the feature combinations which have already been discussed in connection with the illumination optical unit and the metrology system.

A further problem addressed by the invention is that of embodying a pupil influencing assembly including at least one micromirror array such that the stability of said assembly is improved.

This problem is solved according to the invention by an illumination optical unit that includes an optical pupil influencing assembly for influencing an intensity distribution of the illumination light over a pupil of the illumination optical unit, in which the pupil influencing assembly includes at least one MMA, illumination light impinges on at least two used MMA regions arranged in a manner spatially separated from one another, and at least one MMA region on which illumination light does not impinge is arranged between two neighboring used MMA regions from among the used MMA regions arranged in a manner spatially separated from one another.

Owing to the presence of an MMA region on which illumination light does not impinge, the MMA can be oriented in relation to the illumination light impingement such that the illumination light illuminates those MMA regions which are optimally suitable for illumination. By way of example, defect regions on the MMA can be arranged outside the MMA regions on which the illumination light impinges.

In some implementations, the at least one MMA region on which illumination light does not impinge is embodied as an exchange MMA region, in which the beam path of the illumination light is embodied such that it is displaceable relative to the at least one MMA such that a change of an illumination light impingement between at least one used MMA region and at least one assigned exchange MMA region can be carried out. In this case, a position change of the MMA is possible in such a way that, in a first illumination position, the illumination light impinges on two used MMA regions arranged in a manner separated spatially from one another and, in a further position, corresponding exchange MMA regions are used for the exposure. The used MMA regions arranged in a manner separated from one another can be impinged on successively by illumination light in the beam path of the illumination light. More than two used MMA regions with correspondingly assigned exchange MMA regions can also be provided in the pupil influencing assembly.

The illumination optical unit described above can be developed with all individual features or feature combinations which have already been discussed above in connection with the illumination optical unit and the metrology system.

In some implementations, an energy monitoring unit can be used for monitoring an energy of the illumination light that is incident on the object field. As an alternative or in addition to the energy monitoring unit, an intensity monitoring unit can also be provided. The object field illumination can be monitored in a spatially resolved fashion over the object field. An intensity distribution can be monitored in a spatially resolved fashion over the object field. Alternatively or additionally, monitoring can take place in the beam path of the illumination light upstream of the object field and/or downstream of the object field.

DESCRIPTION OF DRAWINGS

Exemplary embodiments of the invention are explained in greater detail below with reference to the drawings, in which:

FIG. 2 shows an excerpt from a beam path of illumination light which is guided by the illumination optical unit according to FIG. 1, in the region of a pupil homogenizing assembly, embodied as a fly's eye condenser;

FIG. 3 schematically shows an excerpt from the fly's eye condenser according to FIG. 2, wherein the illustration shows details regarding the beam guiding of two partial beams of a total beam of the illumination light guided by the illumination optical unit, said partial beams being illustrated in each case by three individual rays;

FIG. 4 shows, in a mirror-inverted fashion with respect to a perpendicular plane in comparison with FIG. 1, a pupil shaping assembly of the illumination optical unit according to FIG. 1 including a sequential optical unit;

FIG. 5 schematically shows a beam shaping effect of the pupil shaping assembly according to FIG. 4, wherein actually reflective gratings, embodied by multi-mirror arrays (MMAs) of the pupil shaping assembly, are illustrated as transmission gratings;

FIG. 14 shows, in an illustration similar to FIG. 13, a further embodiment of a beam guiding of the beam of the illumination light in a further embodiment of a pupil shaping assembly;

FIG. 15 shows a view of an excerpt from the beam path of the illumination light in the embodiment according to FIG. 14 in the region of an entrance-side cylindrical lens telescope in accordance with viewing direction XV in FIG. 14;

FIG. 16 shows a further embodiment of a beam path of the illumination light in the region of a micromirror array of an embodiment of the pupil shaping assembly;

FIG. 17 shows a plan view of the micromirror array from viewing direction XVII in FIG. 16;

FIG. 18 shows, in an illustration similar to FIG. 16, a further embodiment of a beam guiding of the illumination light in the region of a micromirror array of the pupil shaping assembly;

FIG. 38 shows a diagram showing the dependence of an intensity proportion reflected by the respective MMA region, indicated in percent, on a tilting angle of the respective micromirror of the MMA region;

FIG. 39 schematically shows a plan view of a first MMA region of the pupil shaping assembly with micromirror subregions whose tilting angle is set for the purpose of setting a corresponding reflectivity at assigned tilting angle operating points;

FIG. 40 shows, in an illustration similar to FIG. 39, a plan view of the further MMA region of the pupil shaping assembly with in turn assigned tilting angle operating point setting of stipulated MMA subregions; and FIG. 41 shows an overall effect of the two MMA regions set according to FIGS. 39 and 40 on an intensity distribution of the illumination light over an illumination pupil, illustrated in a form comparable to FIGS. 39 and 40 in a plan view.

DETAILED DESCRIPTION

Figure 1:
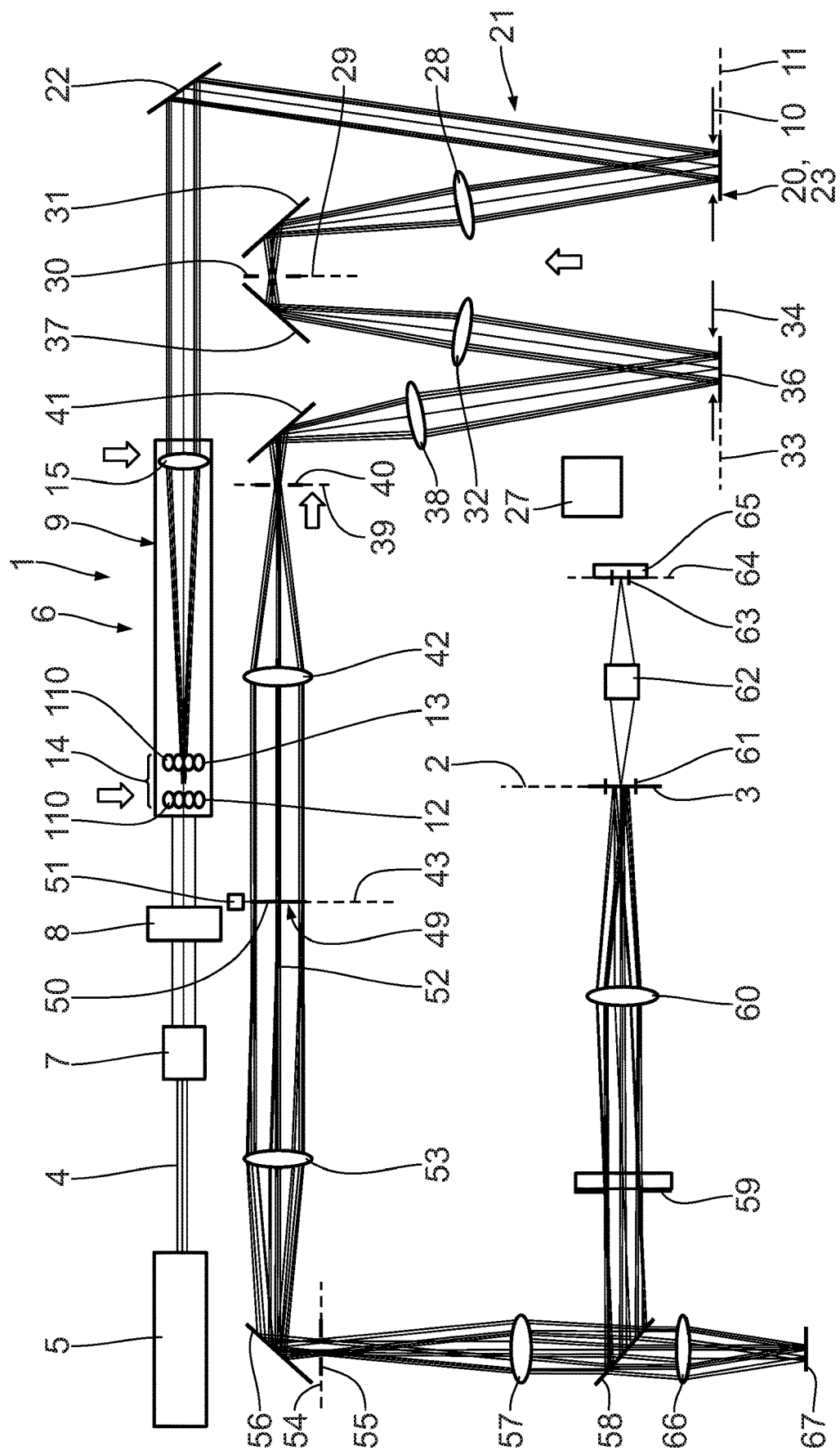
FIG. 1 shows, in an overview illustration which is a meridional section for some of the components shown, a metrology system for examining objects, wherein an illumination optical unit for illuminating the object to be examined is part of the metrology system.
Figure 6:
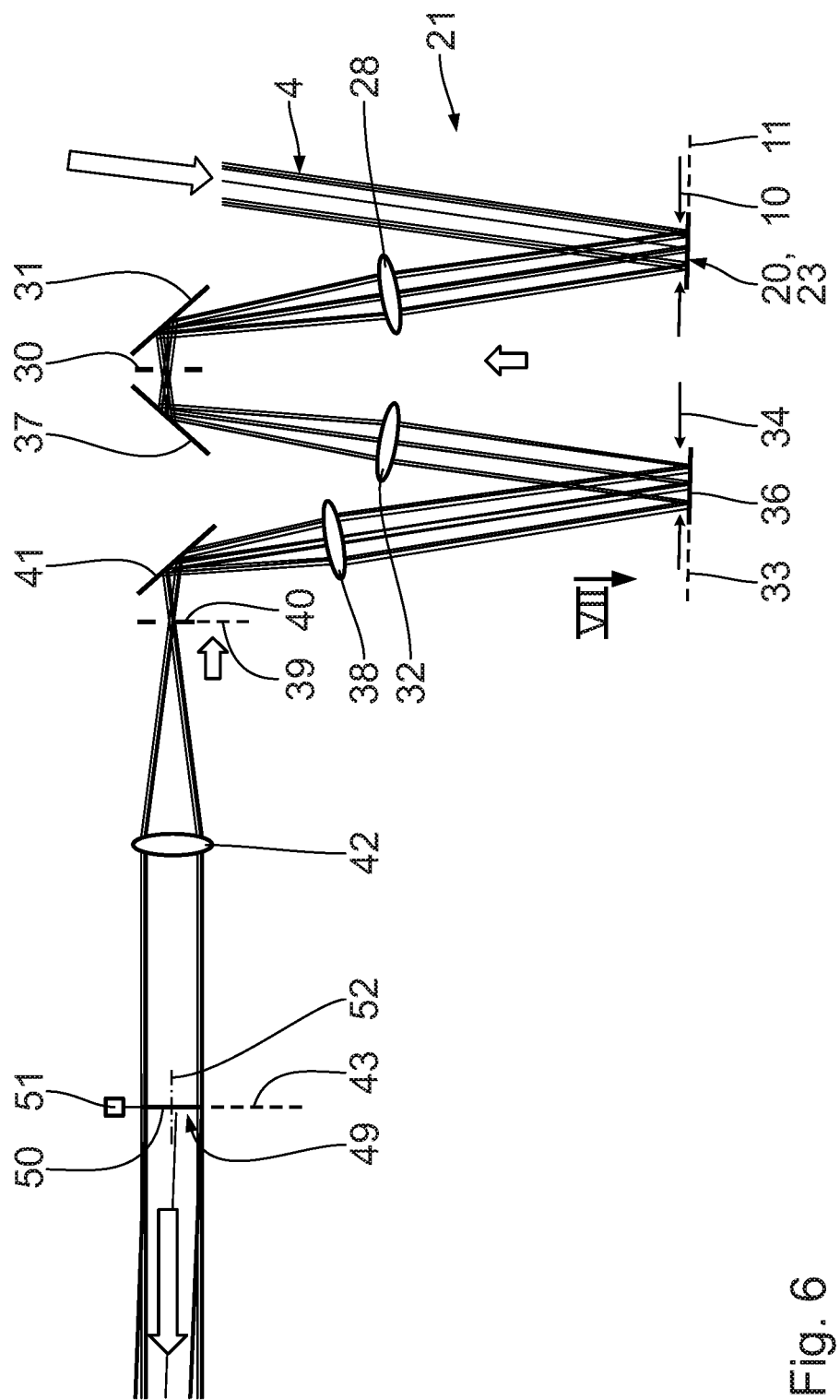
FIG. 6 shows an excerpt from the beam path of the illumination light in the illumination optical unit according to FIG. 1 in the region of the pupil shaping assembly and a sequential optical unit including a field shaping assembly.

FIG. 1 shows, as a whole and schematically, a metrology system 1 for the highly spatially resolved examination of objects, arranged in an object plane 2. A lithography mask 3 in the object plane 2 is depicted schematically as an example of such an object in FIG. 1. Such lithography masks 3 are also designated as reticles. With the metrology system 1, a topography and an optical behavior of the reticle 3 can be examined and tested for operation in a projection exposure apparatus in particular for DUV or EUV projection lithography. By way of example, defects on the reticle 3 can be identified and measured by the metrology system 1. An influence of structures on the reticle 3 on a guiding of illumination light 4 or of projection light during the projection lithography can also be measured by the metrology system 1. The illumination light 4 is indicated schematically in FIG. 1 by a plurality of individual rays which proceed from different field points with respectively three different ray angles (one chief ray, two coma rays).

The illumination light 4 is generated by a light or radiation source 5, which, in the exemplary embodiment illustrated, is a DUV laser, for example a laser for generating a wavelength of 193 nm. An EUV light source is also possible, in principle, wherein the transmissive optical components described below are then generally embodied as reflective optical components. Instead of a converging lens, for example, a concave mirror of corresponding refractive power is then used.

An illumination optical unit 6 of the metrology system 1 serves for guiding the illumination light 4 between the light source 5 and the reticle 3 and detection and/or monitoring components of the metrology system 1, said illumination optical unit being explained below.

A beam expanding device 7 for expanding a beam cross section of the illumination light 4 is arranged downstream of the light source 5. The beam expanding device 7 can be, for example, a correspondingly dimensioned Galilean telescope. A beam cross section of the illumination light 4 is expanded by a factor of 10, for example, by the beam expanding device 7.

A depolarizer 8 is arranged downstream of the beam expanding device 7 in the beam path of the illumination light 4, said depolarizer converting illumination light 4 which is initially incident on the depolarizer 8 in a polarized fashion into illumination light 4 which leaves the depolarizer 8 in an unpolarized fashion.

A pupil homogenizing assembly 9 is arranged downstream of the depolarizer 8 in the beam path of the illumination light 4. Said pupil homogenizing assembly serves for homogenizing an intensity distribution of the illumination light over a pupil 10 in a pupil plane 11 of the illumination optical unit 6. The pupil homogenizing assembly has two microlens arrays (MLA) 12, 13 arranged one after another in the beam path of the illumination light 4, said microlens arrays together forming a fly's eye condenser 14 known in principle from the prior art. A zoom lens 15 furthermore belongs to the pupil homogenizing assembly 9.

FIGS. 2 and 3 schematically show the function of the pupil homogenizing assembly 9. FIG. 3 shows a beam path of two partial beams 4a, 4b of the entire beam of the illumination light 4, which are incident on assigned microlenses 16 of the—in the beam path of the illumination light 4—first microlens array 12 of the fly's eye condenser 14 of the pupil homogenizing assembly 9. The partial beams 4a, 4b are each represented by two coma rays 17 and one chief ray 18.

The—in the beam path of the illumination light 4—second microlens array 13 of the fly's eye condenser 14 of the pupil homogenizing assembly 9 is arranged in the region of a field plane 19 of the illumination optical unit 6. The zoom lens 15 acts as a condenser and transfers the illumination light partial beams 4a, 4b in a manner being superimposed on one another into the pupil 10 in the pupil plane 11. This superimposition of all the illumination light partial beams 4a, ... which are incident on the respective microlenses 16 of the fly's eye condenser 14 in the pupil 10 leads to the homogenization of an intensity distribution of the illumination light 4 over the pupil 10.

Depending on the embodiment of the fly's eye condenser 14, the microlenses 16 can have a square, rectangular, hexagonal, hexagonally distorted, round or other shape, for example an elliptic, polygonal or triangular shape, in a plan view.

Depending on the embodiment, the fly's eye condenser 14 can include exactly one microlens array or a plurality of microlens arrays, for example two microlens arrays. The microlenses 16 can be embodied as planoconvex, biconvex, planoconcave or biconcave. The microlenses 16 can be crossed cylindrical lenses having a crossing angle of, in particular, 90°. The microlenses 16 can also be triply crossed cylindrical lenses. In this case, three beam shaping surfaces (concave or convex), distributed between two optical components, are arranged one after another in each case with a crossing angle of 60°. A fourth surface can be embodied in planar fashion.

Further variants of a homogenizing assembly which can be used for pupil homogenizing and/or for field homogenizing will be explained below. By way of example, a diffusing plate can be used as a homogenizing assembly. Alternatively or additionally, an element having diffractive and/or refractive microstructures can be used as a homogenizing assembly. A homogenizing element of the homogenizing assembly can be embodied as static or displaceable in a driven fashion. A driven displacement can be a rotation or else an, in particular oscillating, translation.

The pupil plane 11 is arranged adjacent to the zoom lens 15 schematically in FIG. 2. In actual fact, the first pupil plane 11 lies downstream of the field plane 19 in the region of a first micromirror array (MMA) region 20 of a pupil shaping assembly 21 of the illumination optical unit 6, the essential components and functions of which are illustrated in FIGS. 4 to 7.

A deflection mirror 22 of the illumination optical unit 6 is arranged between the zoom lens 15 and the first MMA region 20.

Figure 7:
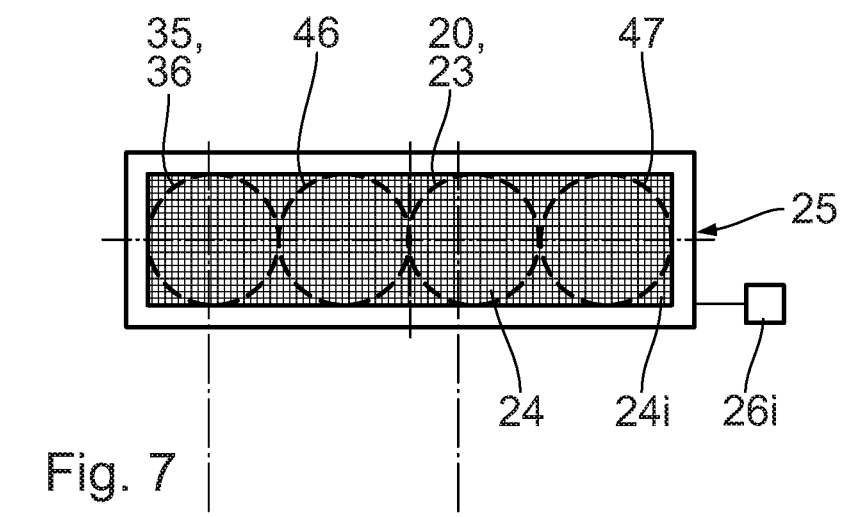
FIG. 7 shows a plan view of a micromirror array from viewing direction VII in FIG. 6, in a first displacement position of the micromirror array.

The first MMA region 20 is illuminated with a round illumination light spot 23, as shown by the plan view according to FIG. 7. Said spot 23 is incident on a multiplicity of micromirrors 24 of the MMA region 20. The micromirrors 24 are arranged in a two-dimensional grid in the micromirror region 20. The micromirrors 24 each have square reflection surfaces. A distance between two adjacent mirror rows of the micromirrors 24 in the MMA region 20 is coordinated with a wavelength of the illumination light 4 such that the illumination light 4 is guided by the MMA region 20 in zero order of diffraction of the illumination light 4 in the direction of downstream components of the pupil shaping assembly 21 or of the illumination optical unit 6. The MMA region 20 is therefore embodied as a diffraction-reflection grating for the illumination light 4. An input divergence of the illumination light 4 on the MMA region 20 and an angle of incidence of the illumination light 4 on the MMA region 20 are chosen such that orders of diffraction higher than the zero order of diffraction pass on beam paths separate from the zero order of diffraction, that is to say can be separated from the beam path of the zero order of diffraction.

The MMA region 20 is part of an entire MMA 25 illustrated in FIG. 7.

The micromirrors 24 of the MMA 25 can be adjusted individually within a tilting angle range by an actuator system. An associated tilting actuator 26i is illustrated schematically for a micromirror 24i in FIG. 7. The tilting actuators 26 of all the micromirrors 24 of the MMA 25 are signal-connected to a central control device 27 of the illumination optical unit 6 or of the metrology system 1 in a manner that is not illustrated.

The central control device 27 is signal-connected to the further components of the illumination optical unit 6 and of the entire metrology system 1.

Depending on the embodiment of the MMA 25, the micromirrors 24 are continuously adjustable within the tilting angle range or can be switched discretely between a plurality of tilting angles, for example between two tilting angles, within the tilting angle range.

By use of the respective tilting actuator 26i, each micromirror 24i can be tilted between an on position and an off position. In the on position, an angle of reflection of the micromirror 24i for the illumination light 4 corresponds to the angle of the zero order of diffraction. The on tilting position is therefore a blaze tilting position. In other words, the micromirrors 24 are then blazed mirrors. Those regions of the MMA 25 on which the illumination light 4 impinges therefore act as blazed gratings having an adjustable blaze angle. In the off position, the micromirror 24i is tilted such that practically no illumination light 4 is reflected in the direction of the zero order of diffraction. The tilting angle in the off position is, for example, such that the illumination light 4 is reflected in the direction of the first order of diffraction. Alternatively, in the off position of the micromirror 24i, the illumination light 4 can also be reflected in the direction of a different order of diffraction or in a direction between two orders of diffraction of the diffraction-reflection grating of the MMA region 20 for the illumination light 4. The choice of the off tilting angle position of the micromirrors 24 is such that particularly efficient suppression of the illumination light 4 reflected by the micromirrors 24 in the off position is subsequently possible.

The beam path of the illumination light 4 onto the MMA region 20 is designed such that the illumination light 4 is incident on the micromirrors 24 of the MMA region 20 with an input divergence which is less than the diffraction angle $\Psi$ of the first order of diffraction of the diffraction-reflection grating formed by the MMA region. Moreover, the beam path of the illumination light 4 onto the MMA region 20 is designed in such a way that the illumination light 4 is incident on a micromirror principal plate of the MMA region 20 with an angle of incidence which is greater than 0°, greater than 5°, and is approximately 10° in the embodiment according to FIG. 1. The micromirror principal plane coincides with the pupil plane 11. Angles of incidence of greater than 10°, for example angles of incidence in the range of 15° or greater or in the region of 20°, on the micromirror principal plane of the MMA region 20 are also possible.

A further condenser lens 28 transfers the illumination light 4 reflected by the MMA region 20 into a further field plane 29. In the case of the illumination optical unit 6 according to FIG. 1, the field plane 29 is the first field plane downstream of the field plane 19. A spatial filter stop 30 is arranged in the field plane 29. Said spatial filter stop serves for selecting a zero order of diffraction of the illumination light 4 reflected by the MMA region 20, that is to say for suppressing further orders of diffraction, that is to say the +/−first and higher orders of diffraction. A further deflection mirror 31 for the illumination light 4 is arranged between the condenser lens 28 and the spatial filter stop 30. A further condenser lens 32 transfers the illumination light 4 from the field plane 29 into a further pupil plane 33. The pupil planes 11 and 33 coincide in the case of the embodiment illustrated.

Within a pupil 34, the illumination light 4 in the pupil plane 33 in an illumination light spot 35 (also cf. FIG. 7) is incident on a further MMA region 36 on the MMA 25. A further deflection mirror 37 for the illumination light 4 is arranged between the spatial filter stop 30 and the condenser lens 32 disposed downstream in the beam path of the illumination light 4.

The effect of the further MMA region 36 on the illumination light 4 corresponds to that of the MMA region 20 on the illumination light 4. A further pupil shaping can be performed by the further MMA region 36, which in turn acts on the illumination light 4 as a diffraction-reflection grating, depending on which of the micromirrors 24 of the further MMA region 36 are in the on position and in the off position. Micromirrors 24 in the off position in the MMA regions 20 and respectively 36 lead to corresponding dark regions in the pupil. Pupil regions associated with illumination light partial beams which are incident on micromirrors in the on position both in the MMA region 20 and in the MMA region 36 lead to bright regions in the pupil of the illumination optical unit 6. Selected illumination settings, that is to say selected illumination angle distributions, for the object illumination can be stipulated in this way.

Generally, the pupil shaping assembly 21 constitutes a pupil influencing assembly since a pupil homogenization, for example, can also be achieved by the pupil shaping assembly 21.

A further condenser lens 38 is disposed downstream of the MMA region 36 in the beam path of the illumination light 4, said further condenser lens transferring the illumination light 4 into a further field plane 39, where there is arranged a further spatial filter stop 40 of the illumination optical unit 6 for suppressing orders of diffraction other than the zero order of diffraction of the illumination light 4 at the further MMA region 36. A further deflection mirror 41 of the illumination optical unit 6 is arranged between the condenser lens 38 and the spatial filter stop 40.

A further condenser lens 42 in the beam path of the illumination light 4 downstream of the spatial filter stop 40 transfers the illumination light 4 into a further pupil plane 43.

FIG. 5 schematically shows the diffracting grating effect of the two MMA regions 20 and 36 of the pupil shaping assembly 21. The MMA regions 20 and 36 are illustrated schematically in transmission in FIG. 5. The beam path is shown from the MMA region 20 to downstream of the condenser lens 42. The deflection mirrors 31, 37 and 41 have been omitted.

The illumination light 4 is illustrated schematically by wavefronts of identical phase. The illumination light 4 is firstly diffracted at the MMA region 20. The zero order of diffraction 44 is reflected by the blazed micromirrors 24 of the MMA region 20 in the direction of the downstream condenser lens 28. The first order of diffraction 45, which is emitted only with very low reflectivity from the MMA region 20 anyway on account of the blaze angle in the on tilting position of the micromirrors 24, is emitted at a diffraction angle $\Psi$ in comparison with the zero order of diffraction 44 and is blocked downstream of the condenser lens 28 at the field stop 30. Exactly the same selection mechanism subsequently takes place at the further MMA region 36 as well.

The choice of which micromirrors 24*i* in the micromirror regions 20 and respectively 36 are present in the on position and in the off position therefore makes it possible to stipulate which regions of the pupil of the illumination optical unit 6 are bright, that is to say are illuminated, and which regions of the pupil are dark, that is to say are unilluminated.

In the case of a continuous adjustment of the micromirrors 24 in the MMA regions 20 and respectively 36, it is also possible to stipulate any desired grey-scale values between full illumination (both micromirrors assigned to a pupil region in the on position) and full blocking (both micromirrors 24*i* assigned to a pupil region in the off position).

A presetting of the micromirrors 24 in the two MMA regions 20 and 36 can in this case be such that the illumination light 4 is reflected at the MMA region 20 by the micromirrors 24 whose tilting angle driving is effected in a stipulated tilting angle operating point range, wherein the illumination light 4 impinges on the micromirrors 24 of the further MMA region 36 with a tilting angle driving in a second tilting angle operating point range.

The two tilting angle operating point ranges, that is to say the two ranges of the angles of reflection at the micromirrors 24 in the first MMA region 20, on the one hand, and in the second MMA region 36, on the other hand, are different in this case. What can be achieved as a result is that, for example, by using the first MMA region 20, a reflectivity for the zero order of diffraction in the range of between 0% and 30% is achieved by use of a tilting adjustment of the micromirrors 24, wherein a reflectivity range of between 60% and 100% (optimum reflection at the micromirror 24) is achieved in the second MMA region. Alternatively or additionally, the two tilting angle operating point ranges can be chosen such that, in a first tilting angle operating point range, a given tilting angle change leads to a relatively small reflectivity change, wherein, in the second tilting angle operating point range, the same absolute tilting angle adjustment leads to a relatively large reflectivity change.

A sequential impingement on a plurality of MMA regions can be chosen such that use is made of exactly one of the plurality of MMA regions impinged on sequentially in a tilting angle operating point range with low reflectivity and/or a large reflectivity change in the case of a given tilting angle adjustment. These variants enable an optimum fine resolution of grey levels in the case of a sequential impingement on the MMA regions 20 and 36. An exemplary diagram of a dependence between an angle of reflection at micromirrors and a reflectivity on the basis of the example of the intensity reflected into the zero order of diffraction can be found in the technical article "Contrast properties of spatial light modulators for microlithography," J. Heber et al.; Proc. of SPIE Vol. 6730 673035-1. Further explanations concerning the tilting angle operating point ranges will also be found below in connection with FIGS. 36 to 41.

A grey-level illumination at defined pupil spatial regions can also be realized by virtue of the fact that, in the case of a pulsed light source 5, the micromirrors are switched variably for selected light source pulses. This can also be effected in combination with the grey-level setting explained above.

By way of example, overshoots and/or distortions caused by other components of the illumination optical unit 6 can be corrected by use of the grey-level setting.

In the case of a pulsed embodiment of the light source 5, the micromirrors 24 can be driven such that they attain a stipulated desired tilting position during the impingement with the laser pulses, but can return to a starting position, for example, that is to say are not driven, in intervening periods between the laser pulses. The micromirror driving can be constantly "refreshed". The two MMA regions 20 and 36 on the MMA 25 are two used MMA regions which are adjacent but arranged in a manner spatially separated from one another. An MMA region 46 on which illumination light does not impinge is arranged between these two used MMA regions 20 and 36, as illustrated clearly in FIG. 7. Said MMA region 46 is large enough to afford space for a further illumination light spot. On that side of the MMA region 20 which is situated opposite the MMA region 46, the MMA has a further MMA region 47, which is also unused in the position according to FIG. 7.

The two MMA regions 46, 47 on which illumination light does not impinge in the position of the MMA 25 according to FIG. 7 are embodied as exchange MMA regions. The beam path of the illumination light 4 is embodied as displaceable relative to the MMA 25 such that a change of an illumination light impingement between the used MMA regions 20, 36 and the exchange MMA regions 46, 47 can be carried out. In the exemplary embodiment illustrated, the MMA 25 is displaceable relative to the illumination light beam path in the pupil plane 11.

Figure 8:
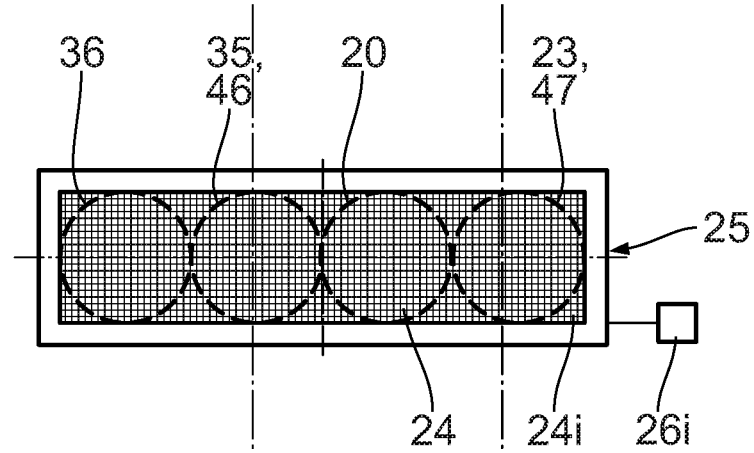
FIG. 8 shows, in an illustration similar to FIG. 7, a plan view of the micromirror array in a second displacement position.

FIG. 8 shows the MMA 25 in a manner displaced relative to the position according to FIG. 7 by a spot diameter of an illumination light spot 23 or 35 in the pupil plane 11. The illumination light spot 23 now coincides with the exchange MMA region 47. The illumination light spot 35 then coincides with the exchange MMA region 46. The MMA 25 can therefore be used as a component of the pupil shaping assembly 21 in two displacement positions. By way of example, if micromirrors in the MMA regions 20 and/or 36 fail, the MMA 25 can be displaced from the position according to FIG. 7 into the position according to FIG. 8, such that now the illumination light 4 impinges on the "fresh" exchange MMA regions 46, 47.

Figure 9:
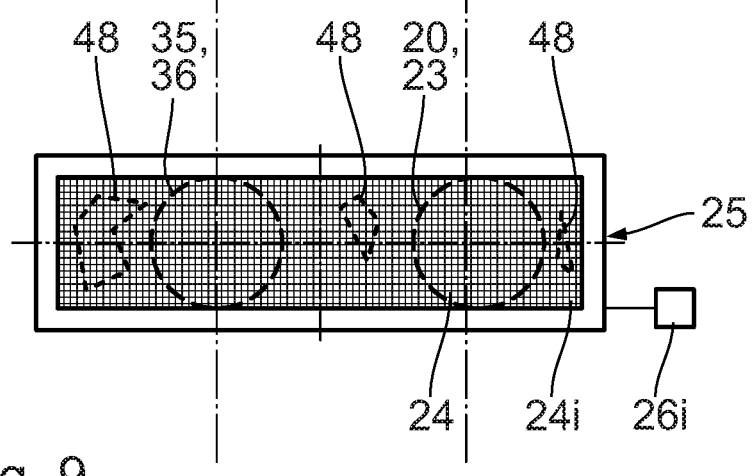
FIG. 9 shows, in an illustration similar to FIGS. 7 and 8, a further embodiment of a micromirror array in a further displacement position.

A further use variant of the configuration of the spaced-apart MMA regions 20 and 36 in the pupil shaping assembly 21 is illustrated in FIG. 9, where the MMA 25 has statistically arranged defect regions 48. On account of the spacing-apart of the MMA regions 20 and 36 used for impingement with the illumination light spot 23 and 35, it is possible, despite the presence of the defect regions 48, to bring the MMA 25 to a position in which none of the defect regions 48 overlaps one of the MMA regions 20 and 36.

In an embodiment which is not illustrated, the at least one MMA region on which the illumination light 4 impinges can be arranged such that it is operated in the second used order of diffraction for the illumination light 4 or in an even higher order of diffraction. The arrangement is then such that the direction in which the downstream spatial filter stop is arranged in the further beam path downstream of the used MMA region corresponds to the diffraction direction of the second or higher used order of diffraction.

The components of the metrology system 1 which are situated downstream of the pupil shaping assembly 21 are explained below. A field shaping assembly 49 of the illumination optical unit 6 is arranged in the pupil plane 43, that is to say in the beam path downstream of the pupil shaping assembly 21. Said field shaping assembly comprises a diffusing plate 50 and a rotary drive 51. By use of the rotary drive 51, the diffusing plate 50 is driven in a manner rotating about an axis 52 of rotation perpendicularly to the plane of the plate.

The axis 52 of rotation runs parallel to the beam path of the illumination light 4 in the region of the diffusing plate 50. The diffusing plate 50 can be arranged relative to the beam path of the illumination light 4 such that the angle of the axis 52 of rotation relative to the beam path of the illumination light 4 in the region of the diffusing plate 50 is less than 30°. In other words, an arrangement—tilted for example up to an angle of 30°—of the diffusing plate 50 with respect to the normal to the beam path of the illumination light 4 is also possible.

A driving of the rotary drive 51 can be effected in a manner synchronized with a driving of the light source 5. In so far as a pulsed light source 5 is used, the rotary drive 51 can be driven for example such that there is a fixed and defined assignment between the respective illumination light pulse and a rotation angle of the diffusing plate 50.

The diffusing plate 50 generates defined output divergence angles of the illumination light 4 in the pupil plane 43, which corresponds in each case to a field location in a downstream field plane. A further condenser lens 53 is disposed downstream of the diffusing plate 50, through which the illumination light 4 passes, in the beam path of the illumination light 4. Said further condenser lens transfers the illumination light 4 from the pupil plane 43 into a further field plane 54, where there is arranged a field stop 55 for defining an outer boundary of an illumination field of the metrology system 1. A further deflection mirror 56 of the illumination optical unit 6 is arranged between the condenser lens 53 and the field stop 55. A tube lens 57 is disposed downstream of the field stop 55 in the beam path of the illumination light 4. A beam splitter 58 for the illumination light 4 is disposed downstream of said tube lens in turn in the beam path of the illumination light 4. The beam splitter 58 is arranged in the region of a further pupil plane of the illumination optical unit.

Polarization elements 59 for generating a defined polarization state of the illumination light 4 are arranged in the beam path of the illumination light 4 that is reflected by the beam splitter 58. A further condenser lens 60 is disposed downstream of the polarization elements 59 in the beam path of the illumination light reflected by the beam splitter 58. An object field 61 in the object plane 2 is disposed downstream of said further condenser lens in the beam path of the illumination light 4. The reticle 3 is arranged such that a portion of the reticle 3 that is to be examined lies in the object field 61. For examination purposes, the object field 61 is imaged into an image field 63 in an image plane 64 by means of a projection optical unit 62, which is illustrated extremely schematically in FIG. 1. The image field 63 can be detected by a spatially resolved detector 65, for example a CCD chip. An imaging beam path for imaging the object field 61 into the image field 63, which imaging beam path is guided by the projection optical unit 62, can be transmitted by the reticle 3, as indicated in FIG. 1, or can alternatively also be reflected and/or diffracted by the reticle 3. Finally, the object field 61 can also be imaged by the projection optical unit 62, without a reticle 3 being arranged in the object field 61. In this case, the metrology system 1 can be used to measure properties of the light source 5 and/or of components of the illumination optical unit 6.

By means of the micromirrors 24 arranged in defined regions of the illumination light spot being transferred to the off tilting position in a targeted manner, what can be achieved is that light is incident on the object field 61 exclusively from directions which are represented by those micromirrors in the illumination light spots which are not arranged in the off tilting angle position. It is possible, for example, to generate the illumination settings for the object field 61 that are known from projection lithography, for example

- a conventional setting with a stipulated maximum illumination angle, in the case of which, within a radius corresponding to this illumination angle, all the micromirrors within a pupil of the illumination optical unit are switched in the on tilting position,
- an annular illumination setting, in the case of which the micromirrors within a ring-shaped region in the pupil are switched in the on tilting position, or
- multipole illuminations, for example a dipole illumination, a quadrupole illumination or else arbitrary combinations of these illuminations.

Depending on the resolution of the pupil shaping, which is stipulated by the number of individually drivable micromirrors in the illuminated MMA regions, it is possible for pupil structures and thus illumination settings to be finely stipulated.

The beam path of the illumination light 4 transmitted by the beam splitter 58 passes through a further condenser lens 66 and is then incident on a monitoring device 67 in the form of an energy monitoring unit for monitoring an energy of the illumination light 4 that is incident on the object field 61, and/or in the form of a spatially resolved intensity monitoring device for monitoring an illumination light intensity distribution over the object field 61 and/or a pupil monitoring unit for monitoring the distribution of illumination angles of the illumination light 4 that is incident on the object field 61. Such monitoring units at the location of the monitoring device 67 are known in principle from the prior art.

In the case of the pupil shaping and/or in the case of the field shaping, an intensity distribution over an actual pupil and/or over an actual field is stipulated such that it corresponds to a desired intensity distribution over the pupil or the field within stipulated tolerances. This can be done by means of feedback using the monitoring device 67.

At least one further relay optical unit can also be arranged, this not being illustrated in the drawing, between the field stop 55 and the tube lens 57, said at least one further relay optical unit imaging the field plane 54 into a downstream field plane 1:1 and thus generating in each case an intervening further pupil plane for the illumination optical unit 6. Such additional relay optical units can be used for beam monitoring and/or for beam shaping. Imaging scales that deviate from 1:1 for the at least one relay optical unit are also possible.

In a variant (not illustrated) of the illumination optical unit 6, the pupil homogenizing assembly 9 can also be dispensed with. One of the above-explained embodiments of the pupil shaping assembly can then concomitantly perform the function of the pupil homogenizing assembly. For this purpose, it is preferred if the micromirrors 24 of at least one of the MMA regions that are impinged on are continuously adjustable, such that, by means of a targeted detuning of the blaze angle by means of the micromirrors, it is possible to achieve a continuous attenuation of a location assigned to the location of the respective micromirror on the pupil of the illumination optical unit 6.

A further embodiment of an illumination optical unit 6 for guiding the illumination light 4 within the metrology system 1 is explained below with reference to FIG. 10. Components corresponding to those which have already been explained above with reference to FIGS. 1 to 9 bear the same reference numerals and will not be discussed in detail again.

Figure 10:
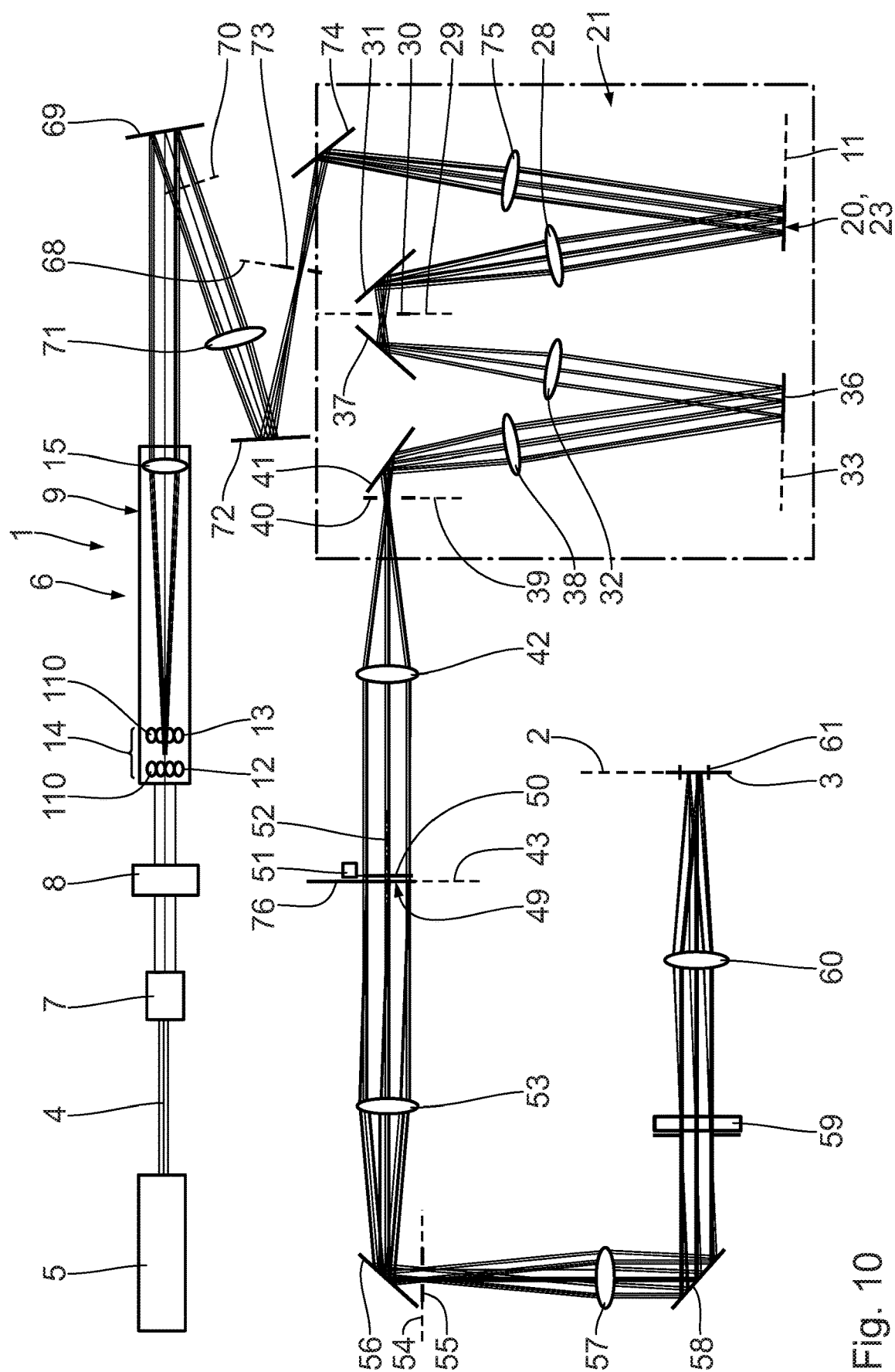
FIG. 10 shows, in an illustration similar to FIG. 1, a further embodiment of a metrology system with a further embodiment of a guiding of an illumination light beam path between the pupil homogenizing assembly and the pupil shaping assembly.

In the embodiment of the illumination optical unit 6 according to FIG. 10, a further field plane 68 is arranged between the zoom lens 15 of the pupil homogenizing assembly 9 and the first MMA region 20.

In the beam path of the illumination light 4 according to FIG. 10, a deflection mirror 69, a pupil plane 70, a condenser lens 71 and a further deflection mirror 72 are arranged between the zoom lens 15 and said further field plane 68. A field stop 73 is arranged in the field plane 68. In the case of the illumination optical unit 6 according to FIG. 10, a further deflection mirror 74 and a further condenser lens 75 are disposed downstream of the field stop 73 in the beam path of the illumination light 4.

In terms of the further course, the beam path of the illumination optical unit 6 according to FIG. 10 corresponds to that of the illumination optical unit 6 according to FIG. 1.

By means of the further field plane 68, it is possible to set beam parameters of the illumination light 4 upstream of the first MMA region 20 independently of the pupil homogenizing assembly 9, for example an input divergence of the illumination light 4 upon incidence on the MMA region 20 and/or a diameter of a beam of the illumination light 4 on the MMA region 20. This can be used, for example, in order to minimize an illumination light intensity loading or an irradiance on the MMA region 20.

The illumination optical unit 6 according to FIG. 10 furthermore has a variant of the field shaping assembly 49. The latter comprises, besides the rotating diffusing plate 50 in accordance with the illumination optical unit 6 according to FIG. 1, in addition a further, static diffusing plate 76. The static diffusing plate 76 and the rotating diffusing plate 50 cooperate for the field shaping of the object field 61 in the illumination optical unit 6 according to FIG. 10.

Figure 11:
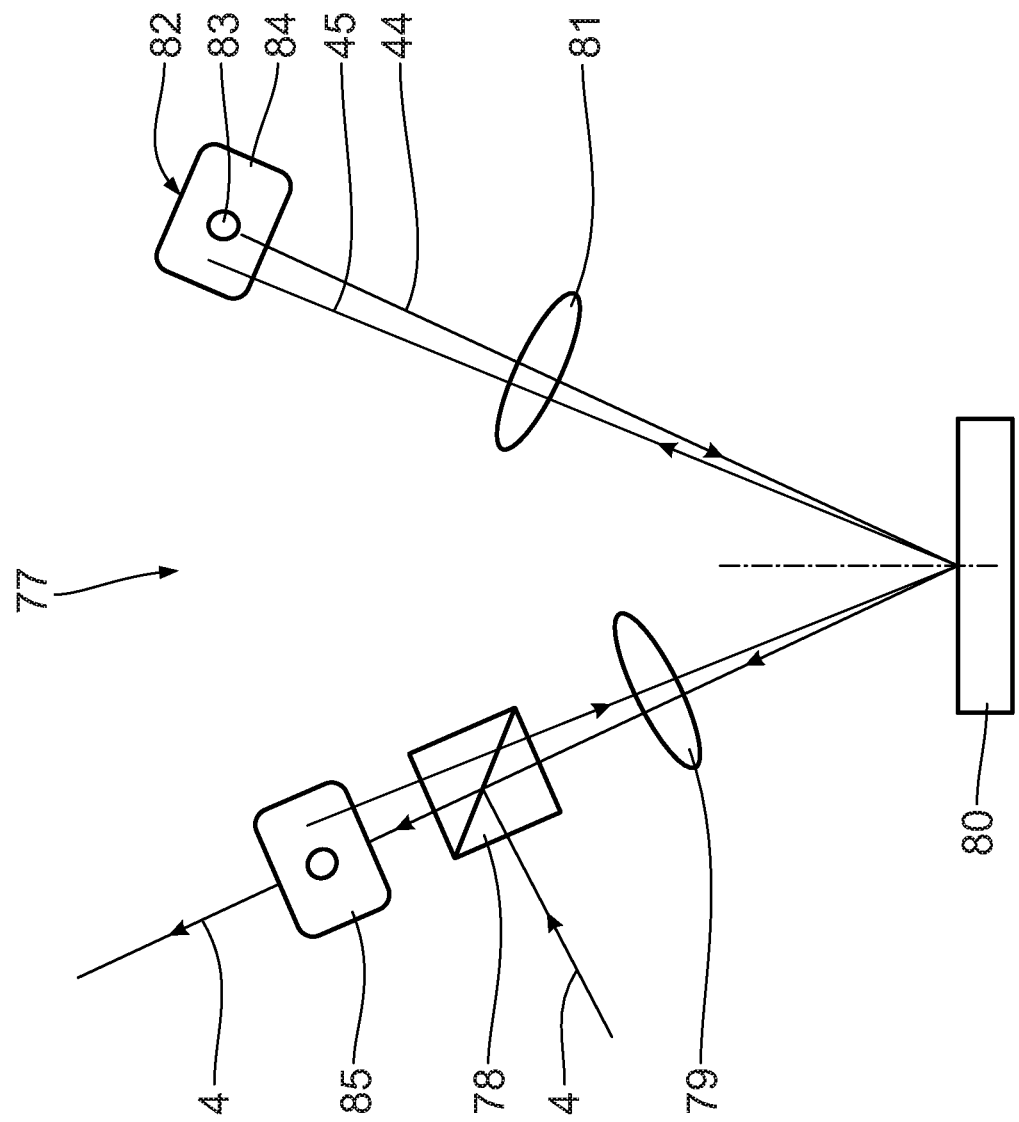
FIG. 11 schematically shows a further embodiment of a beam guiding of the illumination light in the region of a further embodiment of a pupil shaping assembly having exactly one micromirror array.

FIG. 11 shows a variant of a pupil shaping assembly 77 which can be used instead of the pupil shaping assembly 21 according to FIGS. 1 and 10, respectively. In this case, the illustration shows the beam path of the illumination light 4 in each case upstream of a condenser lens upstream of the first MMA region of the pupil shaping assembly. The illumination light 4 is indicated schematically by a central chief ray. In the case of the pupil shaping assembly 77, the illumination light 4 emerging from the pupil homogenizing assembly 9 is firstly incident on a 50% beam splitter 78. Only that proportion of the illumination light 4 which is reflected at the beam splitter 78 is used further. This reflected proportion firstly passes through a condenser lens 79 and is then incident on an MMA 80. The latter is likewise embodied as a reflection-diffraction grating, as already explained above in connection with FIGS. 1 to 10. The MMA 80 is arranged in a pupil plane of the illumination optical unit 6 with the pupil shaping assembly 77. A further condenser lens 81 is disposed downstream of the MMA 80 in the beam path of the illumination light 4. A reflectively coated spatial filter stop 82 is disposed downstream of said further condenser lens in the beam path of the illumination light 4, said spatial filter stop being arranged in turn in a field plane of the illumination optical unit 6 with the pupil shaping assembly 77.

An inner region 83 of the spatial filter stop 82, on which inner region the zero order of diffraction of the illumination light 4 diffracted at the MMA 80 is incident, is embodied in a reflectively coated fashion as a retroreflector. The zero order of diffraction of the illumination light 4 is therefore reflected back on itself at the spatial filter stop 82. Outside the inner, reflectively coated region 83, the spatial filter stop 82 is embodied with an absorbent blocking edge region 84, on which, besides the first order of diffraction 45, even further, higher orders of diffraction of the illumination light 4 diffracted at the MMA 80 are also incident. The zero order of diffraction 44 of the illumination light 4 is therefore selected by means of the spatial filter stop 82. The illumination light 4 reflected back on itself is incident on the MMA 80 again after passing through the condenser lens 81, and in this case a further increase in contrast takes place on account of the second diffraction at the MMA 80. After the first order of diffraction —reflected back on itself—of the illumination light 4 has passed through the lens 79, a used proportion of the illumination light 4 passes through the beam splitter 78 and, downstream thereof, a further spatial filter stop 85, which is in turn arranged in a field plane—disposed downstream of the MMA 80 —of the illumination optical unit with the pupil shaping assembly 77. After passing through the field stop 85, the illumination light 4 proceeding from the condenser lens 42 is guided in the manner explained above in connection with the embodiments according to FIGS. 1 and 10.

Figure 12:
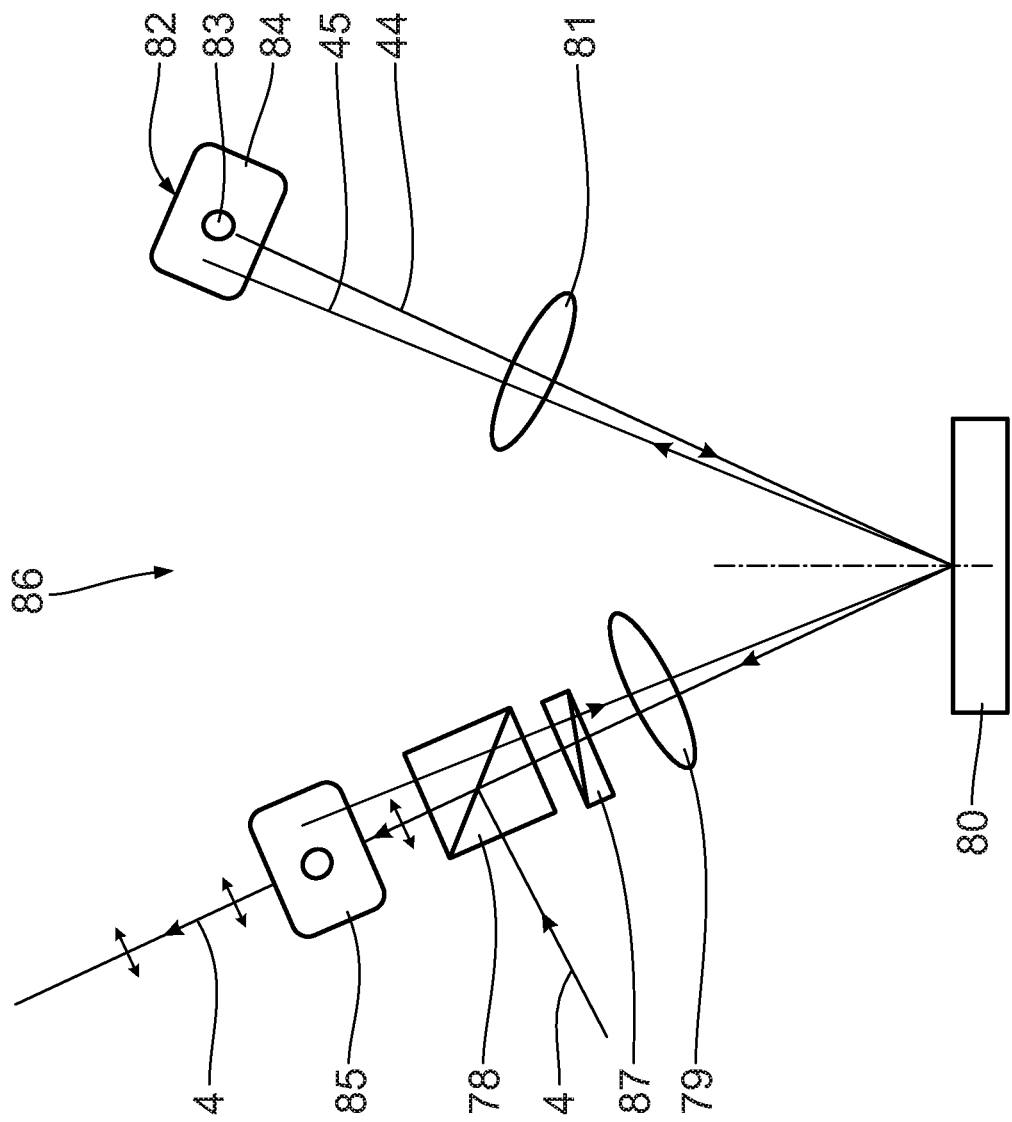
FIG. 12 shows, in an illustration similar to FIG. 11, a further embodiment of a beam guiding of the illumination light in the region of a further embodiment of a pupil shaping assembly having exactly one micromirror array.

A further embodiment of a pupil shaping assembly 86, which can be used instead of the pupil shaping assembly 77 according to FIG. 11, is explained below with reference to FIG. 12.

Components corresponding to those which have already been explained above with reference to FIGS. 1 to 10 and in particular with reference to FIG. 11 bear the same reference numerals and will not be discussed in detail again.

In the illumination optical unit with which the pupil shaping assembly 86 is used, the depolarizer 7 can be dispensed with.

In the pupil shaping assembly 86, the illumination light 4 is incident on the beam splitter 78 in an s-polarized fashion. Said beam splitter is designed such that it reflects the s-polarized light with high reflectance. The used illumination light 4 reflected at the beam splitter 78 firstly passes through a λ/4 plate 87 and subsequently takes the same course as in the pupil shaping assembly 77 according to FIG. 11, that is to say passes through the condenser lens 79, is reflected at the blazed MMA 80, passes through the lens 81, is retroreflected at the spatial filter stop 82, with selection of the zero order of diffraction 44, once again passes through the condenser lens 81 and the blazed MMA 80, once again passes through the condenser lens 79 and, for a second time, now in return, the λ/4 plate 87. The effect of a λ/2 plate, said effect bringing about polarization rotation by 90°, therefore results in total on account of the double pass through the λ/4 plate 87. After the return through the λ/4 plate 87, therefore, the illumination light 4 is p-polarized and is transmitted with high transmittance by the polarizing beam splitter 78 and, after passing through the spatial filter stop 85, is available as used light for further guidance in the illumination optical unit 6.

Figure 13:
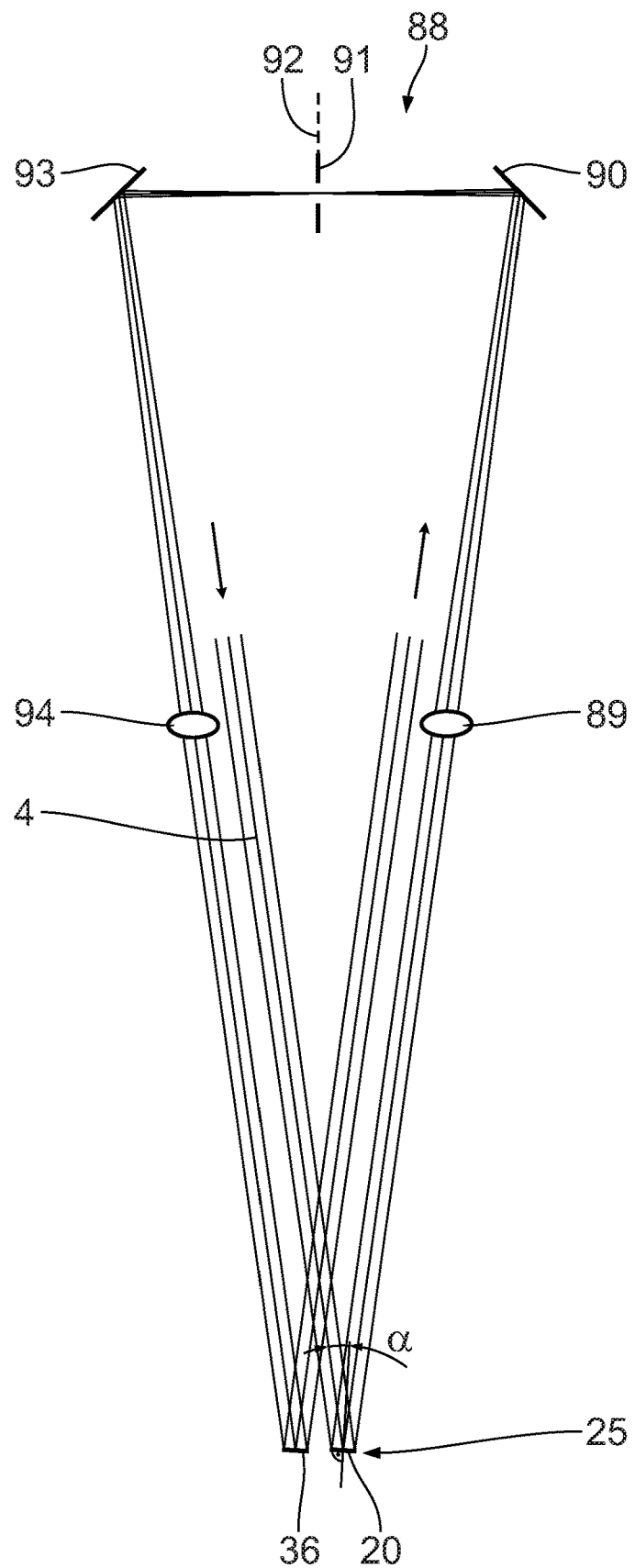
FIG. 13 shows a further embodiment of a beam guiding of a beam of the illumination light in the region of a further embodiment of a pupil shaping assembly, wherein the illustration likewise illustrates a meridional section for some components.

A further variant of a beam guiding in a further embodiment of a pupil shaping assembly 88 is explained below with reference to FIG. 13. Components corresponding to those which have already been explained above with reference to FIGS. 1 to 12 bear the same reference numerals and will not be discussed in detail again. The beam path of the illumination light 4 in FIG. 13 is illustrated functionally between the mirror 22 and the condenser lens 38 in the illumination optical unit 6 according to FIG. 1. Differences in the beam directions at the interfaces with the optical components situated upstream and downstream of the pupil shaping assembly in FIG. 1 can be adapted by means of correspondingly oriented and arranged deflection mirrors.

The illumination light 4 is guided in the shape of a letter "W" in the pupil shaping assembly 88. The illumination light 4 is firstly incident on the MMA region 20 with an angle α of incidence of approximately 8°, is reflected by said MMA region, as already explained above in connection with FIGS. 1 to 12, and then passes through a condenser lens 89, the function of which corresponds to the condenser lens 28 according to FIG. 1. Afterward, the illumination light 4 is reflected at a deflection mirror 90, passes through a spatial filter stop 91 arranged in a field plane 92, is reflected by a further deflection mirror 93 and then passes through a further condenser lens 94. These components 90 to 94 correspond to the components 31, 30, 29, 37 and 32 of the illumination optical unit 6 according to FIG. 1. After passing through the condenser lens 94, the illumination light 4 is incident on the further MMA region 36.

The beam guiding of the illumination light 4 in the pupil shaping assembly 88 is mirror-symmetrical with respect to the field plane 92.

A further embodiment of a beam guiding of the illumination light in a further embodiment of a pupil shaping assembly 95 is explained below with reference to FIGS. 14 and 15. Components corresponding to those which have already been explained above with reference to FIGS. 1 to 13 and in particular with reference to FIG. 13 bear the same reference numerals and will not be discussed in detail again.

In the case of the pupil shaping assembly 95, the illumination light 4 after emerging from the pupil homogenizing assembly 9 is expanded in one dimension, namely in the plane of the drawing in FIG. 14, with the aid of a cylindrical lens telescope including cylindrical lenses 96, 97. The cylindrical lens telescope 96, 97 is embodied as a Kepler telescope. A configuration as a Galilean telescope is also possible. On account of the expanding effect of the cylindrical lens telescope including the cylindrical lenses 96, 97, the MMA region 20 is enlarged by an expansion factor of the cylindrical lens telescope in the pupil shaping assembly 95 in comparison with the pupil shaping assembly 88. An irradiance or an intensity of the illumination light 4 on the MMA region 20 is correspondingly reduced.

In the plane perpendicular to the plane of the drawing in FIG. 14, the cylindrical lenses 96, 97 have no effect, as illustrated in FIG. 15.

In the case of the pupil shaping assembly 95, the illumination light 4 passes through a corresponding W beam path as in the case of the pupil shaping assembly 88 according to FIG. 13. After reflection at the further MMA region 36, by means of a further cylindrical lens telescope including cylindrical lenses 98, 99, the construction of which corresponds to the cylindrical lens telescope including the cylindrical lenses 96, 97, the illumination light 4 is once again collimated for further guiding proceeding from the condenser lens 38 of the illumination optical unit 6 according to FIG. 1.

The beam path of the illumination light 4 in the pupil shaping assembly 95 according to FIG. 14 is also mirror-symmetrical with respect to the field plane 92.

A further embodiment of a guiding of the illumination light 4 upon the reflection at the MMA 25 is described below with reference to FIGS. 16 and 17. Components and functions which have already been explained above with reference to FIGS. 1 to 15 bear the same reference numerals and will not be discussed in detail again.

FIG. 16 shows the beam path of the illumination light 4 upon the reflection at the MMA region 20 between a condenser lens upstream of this reflection and a condenser lens downstream of this reflection. A central chief ray of the illumination light 4 is illustrated in a simplified manner. The illumination light 4 in the beam path upstream and downstream of the MMA region 20 has a round cross section.

The illumination light 4 is incident on the MMA principal plane 11 with an angle α of incidence of 45°.

FIG. 17 shows a cross section of the illumination light spot 23 in a perpendicular plan view of the MMA 25 (viewing direction XVII in FIG. 16).

On account of the angle of incidence α=45°, the illumination light spot 23 appears as an elliptic spot which is wider by approximately a factor of, e.g., 1.4 in the plane of incidence (plane of the drawing according to FIG. 16) than perpendicular thereto. The corresponding area enlargement of the illumination light spot 23 leads to a reduction of the irradiance of the illumination light 4 on the MMA 25. After reflection at the MMA 25, the beam cross section of the illumination light 4 is round again, as illustrated in FIG. 16.

FIG. 18 illustrates the use of a corresponding angle of incidence of 45° in the case of a beam path in a variant of a pupil shaping assembly 100. Components corresponding to those which have already been explained above with reference to FIGS. 1 to 17 and in particular with reference to FIGS. 16 and 17 bear the same reference numerals and will not be discussed in detail again.

After reflection for the first time at the MMA region 20 with an angle of incidence α=45°, the illumination light 4 passes through a condenser lens 101, the effect of which corresponds to the condenser lens 28 according to FIG. 1 or 89 according to FIG. 13, and, after passing through a sequence: deflection mirror 102, field stop 103 in field plane 104, deflection mirror 105 and condenser lens 106, is incident once again with an angle of incidence α=45° on the further MMA region 36. The illumination light spots incident on the MMA regions 20 and 36 are once again elliptic, as already explained above in connection with FIGS. 16 and 17. The beam guiding of the illumination light 4 in the pupil shaping assembly 100 is once again approximately mirror-symmetrical with respect to the field plane 104.

The components 102 to 106 once again correspond to the components 31, 30, 29, 37 and 32 in the illumination optical unit 6 according to FIG. 1. After the reflection at the MMA region 36, a beam of the illumination light 4 that is round in cross section is once again present.

A further variant of a guiding of the illumination light 4 in a further variant of a pupil shaping assembly 107 for reducing an irradiance on the MMA 25 is explained below with reference to FIGS. 19 and 20.

Components corresponding to those which have already been explained above with reference to FIGS. 1 to 18 and in particular with reference to FIGS. 13 to 15 bear the same reference numerals and will not be explained in detail again.

Figure 19:
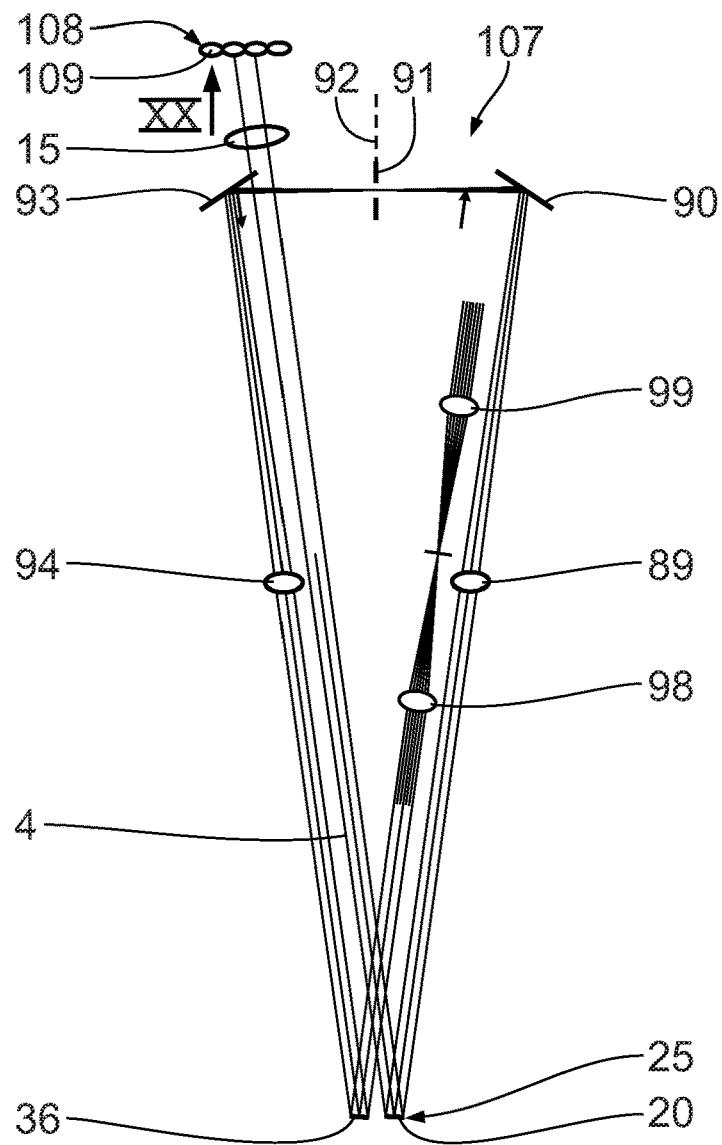
FIG. 19 shows, in an illustration similar to FIG. 13, a further embodiment of a beam guiding of the illumination light starting from a last microlens array of the pupil homogenizing assembly in the region of a further embodiment of a pupil shaping assembly.
Figure 20:
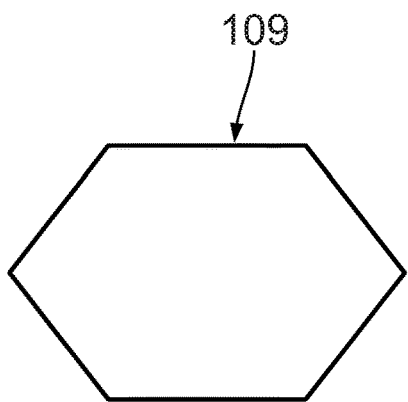
FIG. 20 shows, in a greatly enlarged view from viewing direction XX in FIG. 19, a microlens of the microlens array according to FIG. 19.

FIG. 19 illustrates the beam path of the illumination light 4 proceeding from a—in the beam path—second microlens array 108 of the fly's eye condenser 14 according to FIG. 1. In contrast to the microlens array 13 according to FIG. 1, the microlens array 108 of the pupil shaping assembly 107 has microlenses 109 that are hexagonally stretched in cross section. Such a microlens 109 is illustrated in a greatly enlarged manner in a plan view in FIG. 20. The hexagonal cross section of this microlens 109 is larger in the transverse dimension than in the height dimension approximately by a factor of, e.g., 1.62. This results in a beam shaping effect of the microlens 109, which, in interaction with the zoom lens 15, leads to an elliptically shaped beam of the illumination light 4 downstream of the zoom lens 15. This beam of the illumination light 4 having an elliptic beam cross section is subsequently guided through the pupil shaping assembly 107 via a component sequence 20, 89, 90, 91, 93, 94 and 36 corresponding to that of the pupil shaping assembly 88 according to FIG. 13. On account of the effect resulting from the hexagonally stretched cross-sectional form of the microlenses 109, said effect bringing about greater expansion in the plane of the drawing in FIG. 19, the beam of the illumination light 4 upon the reflection at the MMA regions 20 and 36 is expanded to a greater extent in the plane of the drawing in FIG. 19 in comparison with the guiding according to FIG. 13, which correspondingly reduces the irradiance on the MMA 25. After reflection at the MMA region 36, the elliptic beam of the illumination light 4 is transferred into a beam having a round beam cross section again by means of a cylindrical lens telescope including cylindrical lenses 98, 99 in accordance with the embodiment according to FIG. 14.

Figure 21:
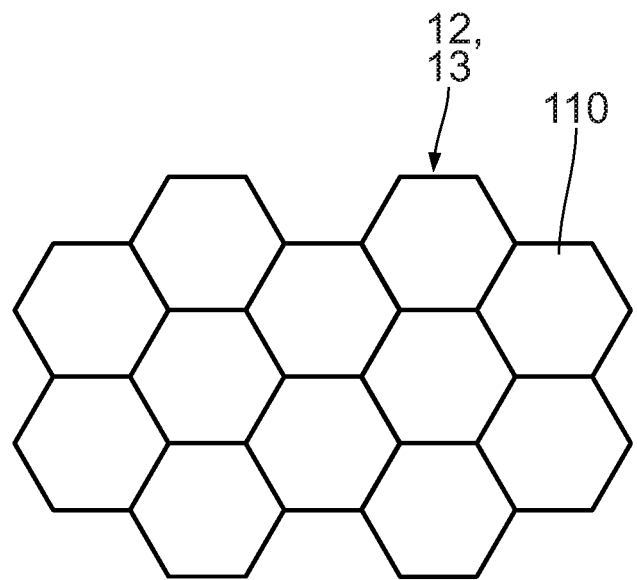
FIG. 21 shows, in a plan view illustration similar to FIG. 20, an excerpt from a microlens array which is used in a pupil homogenizing assembly in the case of the illumination optical unit according to FIG. 1, for example.
Figure 22:
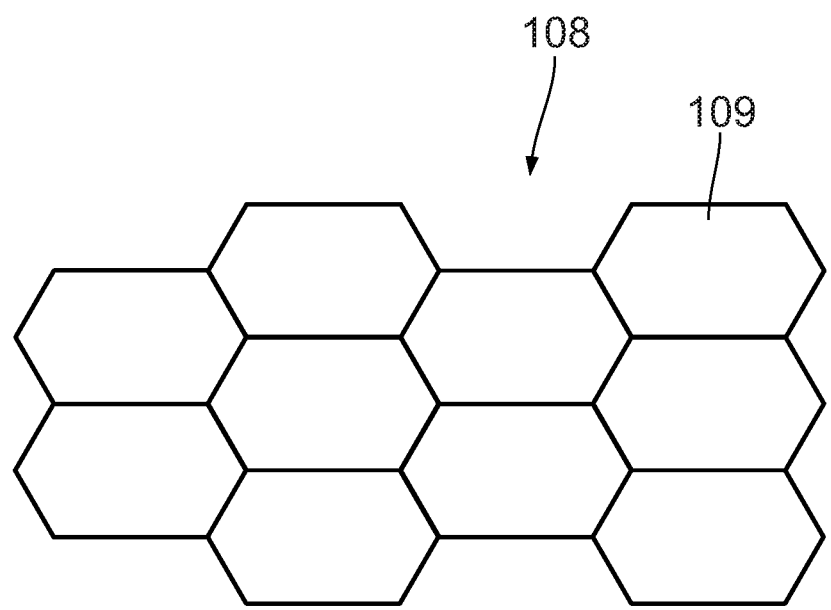
FIG. 22 shows, in an illustration similar to FIG. 21, a plan view of an excerpt from a microlens array which is used in an illumination optical unit including a pupil homogenizing assembly according to FIGS. 19 and 20.

FIGS. 21 and 22 show in comparison microlens arrangements of the microlens arrays 12, 13 of the fly's eye condenser 14 of the illumination optical unit 6 according to FIG. 1 and of the microlens array 108 of the pupil homogenizing assembly according to FIG. 19.

Microlenses 110 of the microlens arrays 12, 13 are embodied hexagonally with sixfold symmetry. In comparison therewith, the microlenses 109 of the microlens array 108 are embodied in a hexagonally stretched fashion, as already explained above in connection with FIG. 20. With both configurations of the microlenses, that is to say the hexagonal embodiment according to FIG. 21 and the hexagonally stretched variant according to FIG. 22, it is possible to achieve a gap-free occupation of the area of the microlens arrays, as illustrated by the respective excerpts from the arrays illustrated in FIGS. 21 and 22.

Figure 23:
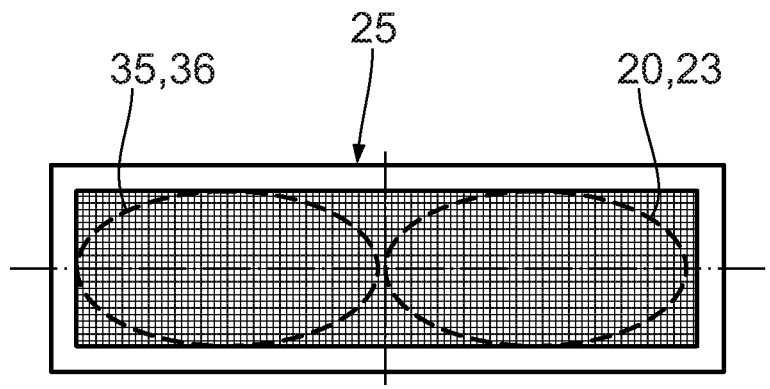
FIG. 23 shows, in an illustration similar to FIGS. 7 to 9, a plan view of a micromirror array of a variant of the pupil shaping assembly with highlighted impingement regions by an elliptically shaped illumination light beam.

FIG. 23 illustrates the occupation of the MMA 25 with illumination light spots 23 and 35 when a spot of the illumination light 4 having an elliptic cross section impinges on the MMA 25. This elliptic impingement can be achieved either by using the angle of incidence α=45°, as explained above in connection with FIGS. 16 to 18, or by using a corresponding cylindrical telescope extension, as explained above in connection with FIGS. 14 and 15, or by using a microlens array of the pupil homogenizing assembly including microlenses having a correspondingly elliptic, for example stretched hexagonal, cross section, as explained above in connection with FIGS. 19 and 20. The explanations given above in connection with the illumination light spots 23 and 35 according to FIGS. 1 to 22 are applicable to the elliptic illumination light spots 23 and 35 according to FIG. 23. In so far as the elliptic illumination light spots 23 and 35 are arranged very close to one another, as illustrated in the example in FIG. 23, a displacement position according to FIG. 8 is not possible, but a displacement position in which at any rate relatively small defect regions on the MMA 25 are omitted, that is to say not impinged on by the illumination light 4, is indeed possible.

Further embodiments of "W"-shaped beam guiding of the illumination light 4 in the vicinity of the MMA regions 20 and 36 are explained below with reference to FIGS. 24 to 33. Components corresponding to those which have already been explained above with reference to FIGS. 1 to 23 and in particular with reference to FIGS. 13 to 23 bear the same reference numerals and will not be discussed in detail again.

Figure 24:
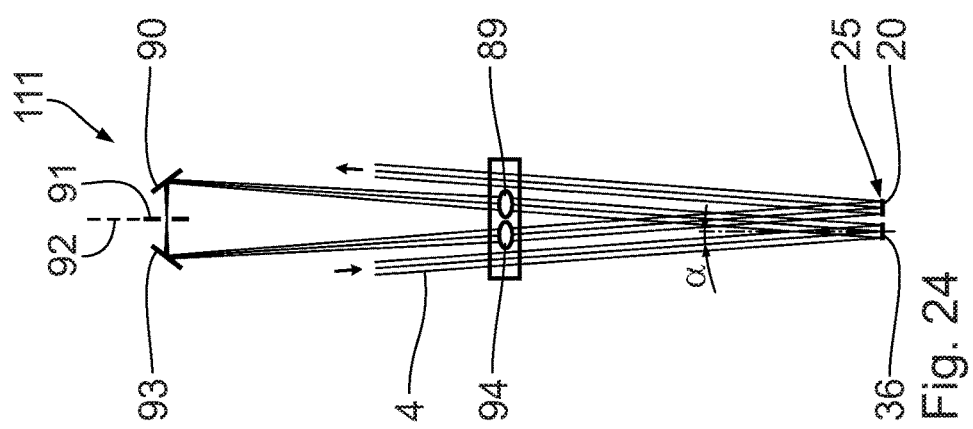

In the case of a pupil shaping assembly 111 according to FIG. 24, the MMA regions 20 and 36 are impinged on with an angle α of incidence of 4°. The partial beam path including the guiding via the two condenser lenses 89 and 94, the deflection mirrors 90 and 93 and the spatial filter stop 91 in this case lies between that partial beam of the illumination light 4 which is incident on the MMA region 36 and that partial beam of the illumination light 4 which is reflected by the MMA region 20. The two condenser lenses 89 and 94 are therefore situated spatially directly alongside one another.

In the case of the beam path of the pupil shaping assembly 111, the illumination light 4 impinges on firstly the MMA region 36 arranged on the left in FIG. 24 and then the MMA region 20 arranged on the right in FIG. 24. The impingement order is therefore exactly opposite to that for example in the case of the pupil shaping assembly 88 according to FIG. 13. The beam path within the pupil shaping assembly 111 is also W-shaped and mirror-symmetrical with respect to the field plane 92.

Figure 25:
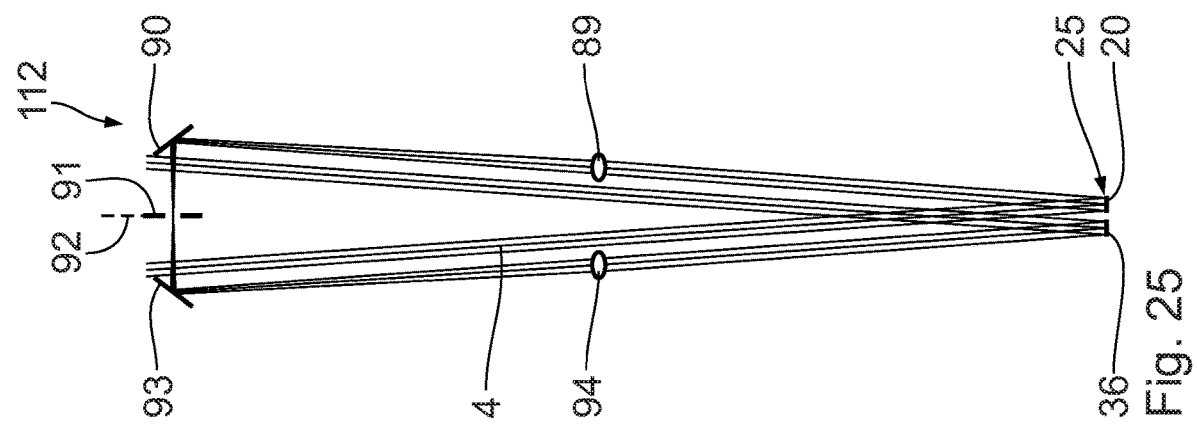
FIG. 24 to FIG. 33 show, in each case in an illustration similar to FIG. 13, further embodiments of the guiding of the illumination light in further embodiments of pupil shaping assemblies.

FIG. 25 shows a further pupil shaping assembly 112 as a variant of the pupil shaping assembly 88 according to FIG. 13. There are differences with regard to the angle of incidence of the illumination light on the MMA regions 20 and 36, said angle being 4° in the case of the pupil shaping assembly 112, and a distance between an aperture of the spatial filter stop 91 and the MMA 25, said distance being larger in the case of the pupil shaping assembly 112 than in the case of the pupil shaping assembly 88 in order to realize the smaller angle of incidence.

Figure 26:
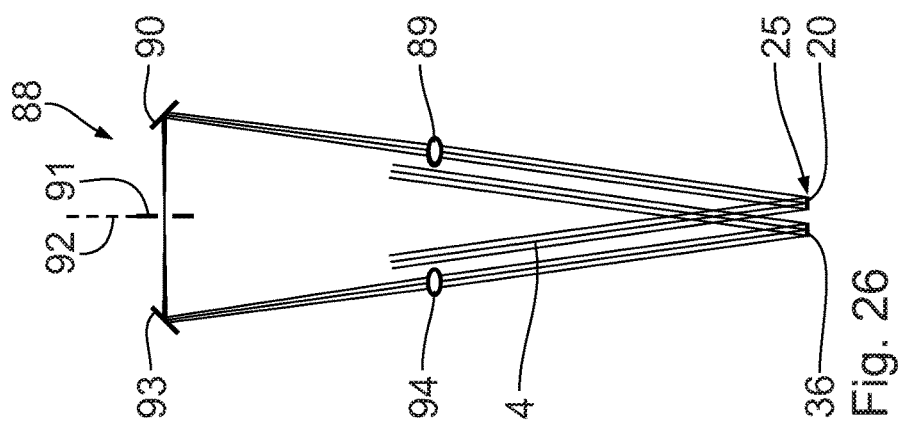

FIG. 26 shows the pupil shaping assembly 88 again.

Figure 27:
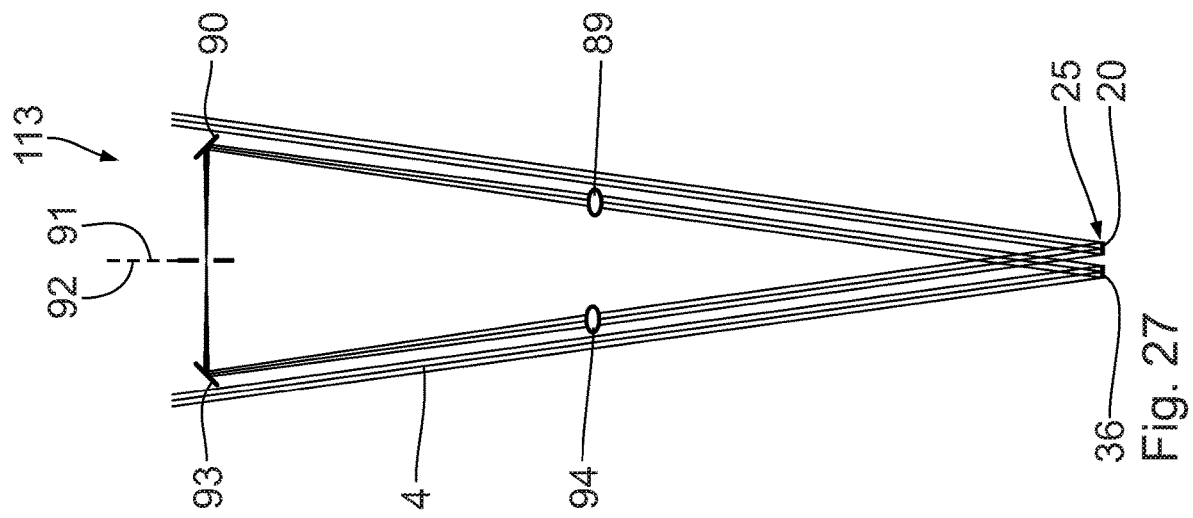

FIG. 27 shows a pupil shaping assembly 113 having a basic W beam guiding of the illumination light 4 as in the case of the pupil shaping assembly 111 according to FIG. 24, the pupil shaping assembly 113 having an angle of incidence on the MMA regions 20 and 36 of 8°. The focal lengths of the condenser lenses 89 and 94 are larger in the case of the pupil shaping assembly 113 than in the case of the pupil shaping assembly 111. The distance between a through aperture of the spatial filter stop 91 and the MMA 25 is also larger in the case of the pupil shaping assembly 113 than in the case of the pupil shaping assembly 111.

Figure 28:
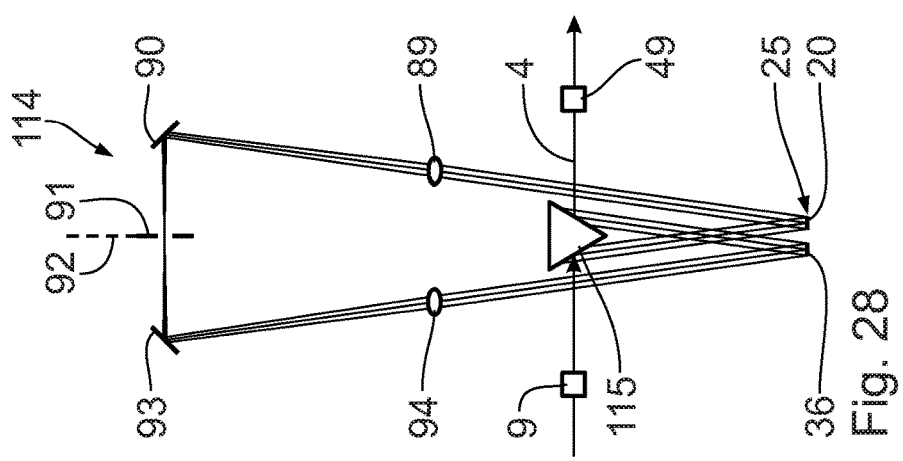

FIG. 28 shows a development of the pupil shaping assembly 88 according to FIGS. 13 and 26 as a further embodiment of a pupil shaping assembly 114. The illumination light 4 is coupled in via a reflection surface of an input coupling prism 115 in order to impinge on the MMA region 20 and is coupled out at a further reflection surface of the input coupling prism 115 after reflection at the further MMA region 36. A beam path incident on the input coupling prism 115 and a beam path of the illumination light 4 reflected by the input coupling prism 115 after passing through the pupil shaping assembly 114 are aligned with one another. In other words, in the case of the pupil shaping assembly 114 there is no need for a further deflection mirror between the pupil homogenizing assembly 9 and the field shaping assembly 49, which are depicted schematically in FIG. 28.

The input coupling prism 115 lies between the partial beam path of the illumination light 4 between the MMA region 20 and the deflection mirror 90, on the one hand, and the partial beam path between the deflection mirror 93 and the further MMA region 36, on the other hand.

Figure 29:
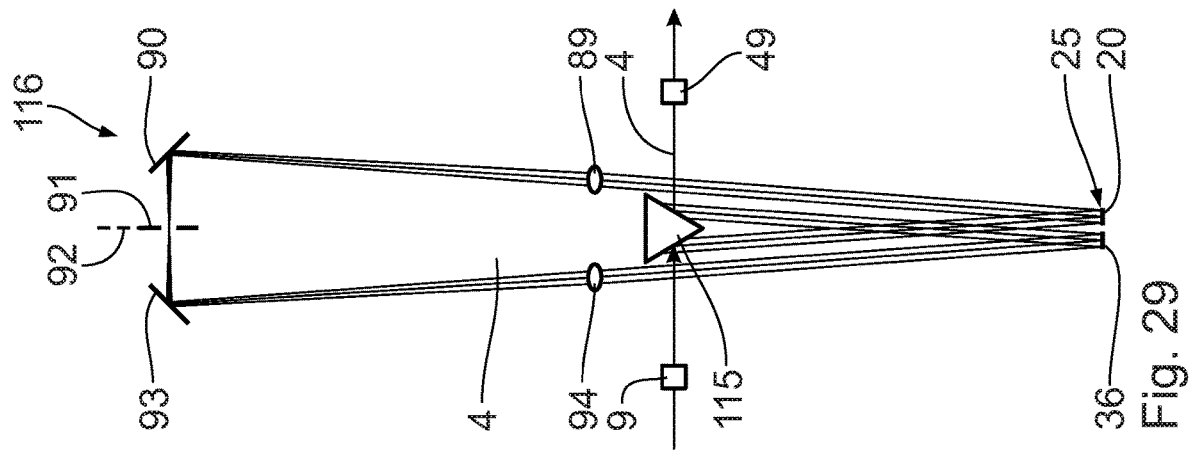

FIG. 29 shows a further embodiment of a pupil shaping assembly 116 as a development of the pupil shaping assembly 112 according to FIG. 25, additionally equipped with an input coupling prism 115 in accordance with the pupil shaping assembly 114.

In the case of the pupil shaping assemblies 114 and 116, a prism angle of the input coupling prism 115 is adapted, of course, to the beam guiding requirements for the illumination light 4 such that an aligned guiding of the illumination light 4 coupled into and out of these pupil shaping assemblies 114 and 116 results in each case.

Figure 30:
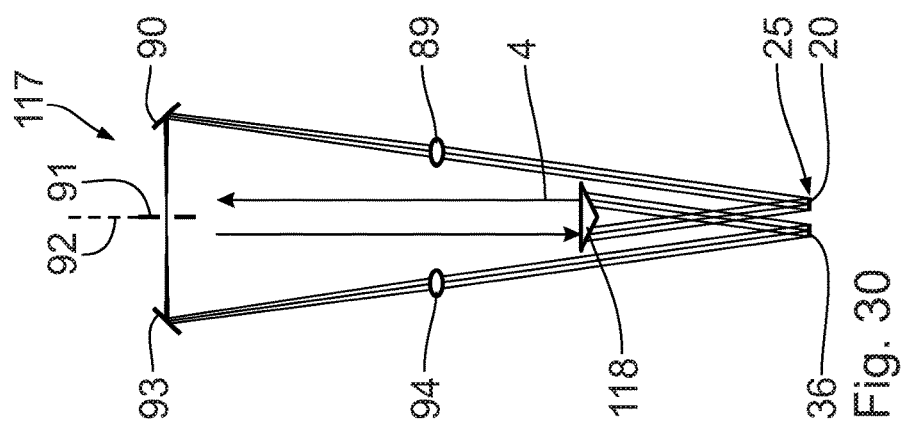

FIG. 30 shows a further input coupling variant in the case of a further embodiment of a pupil shaping assembly 117, which otherwise corresponds to the pupil shaping assembly 114. In this case, input coupling is effected via a refractive input coupling prism 118 rather than via a reflective input coupling prism. A partial beam of the illumination light 4 which is incident in the pupil shaping assembly 117 and which is directed onto the MMA region 20 via the input coupling prism 118 and a partial beam of the illumination light 4 which emerges from the pupil shaping assembly 117 and which passes through a mirror-symmetrically embodied refraction surface of the input coupling prism 118 run antiparallel to one another and pass through the spatial filter stop 91 parallel to the aperture plane thereof at opposite sides.

Figure 31:
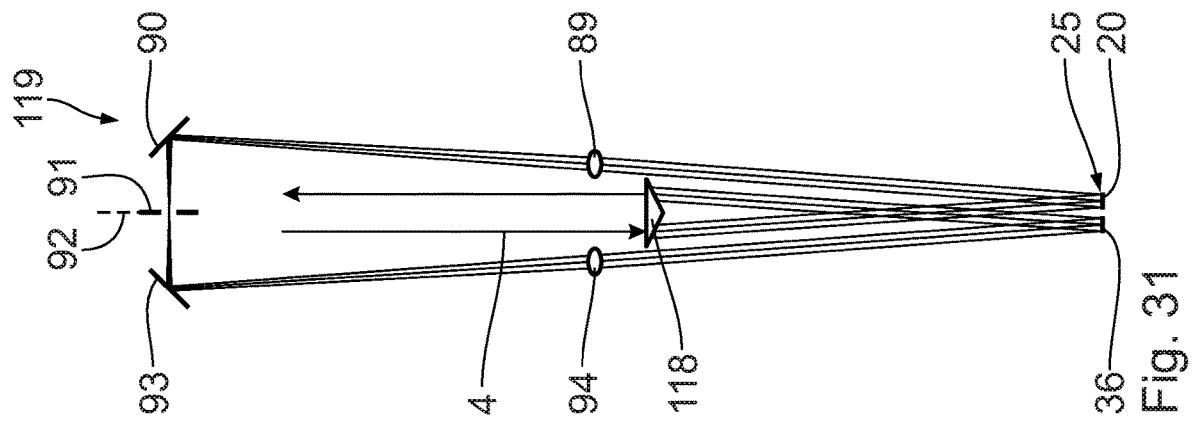

FIG. 31 shows, in a further embodiment of a pupil shaping assembly 119, the input coupling concept with a refractive input coupling prism 118 in the case of a pupil shaping assembly which otherwise corresponds to the pupil shaping assembly 116 according to FIG. 29. Here, too, the partial beams of the illumination light 4 which are incident in and emerge from the pupil shaping assembly run antiparallel to one another.

Figure 32:
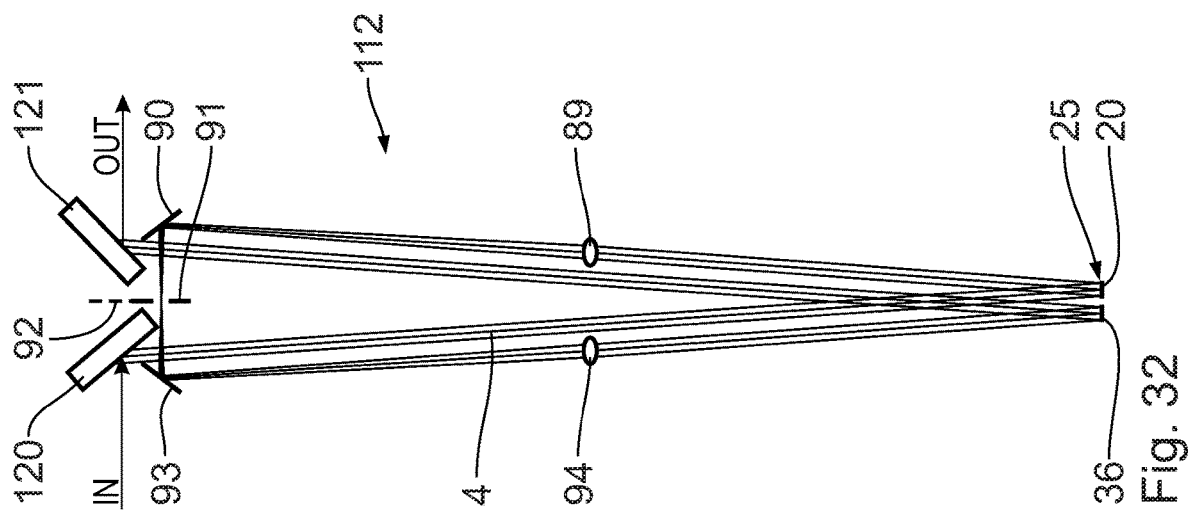

FIG. 32 shows a variant of a beam input and output coupling for the illumination light 4 into and out of the pupil shaping assembly 112 according to FIG. 25. A deflection mirror 120 serves for beam input coupling, said deflection mirror reflecting the illumination light 4 toward the MMA region 20. A further deflection mirror 121 serves for the output coupling of the illumination light 4, at which further deflection mirror the illumination light 4 reflected by the further MMA region is reflected toward the field shaping assembly 49. The two deflection mirrors 120, 121 are arranged on that side of the partial beam path which faces away from the MMA 25 between the deflection mirrors 90 and 93. That partial beam of the illumination light 4 which is incident on the deflection mirror 120 and that partial beam of the illumination light 4 which emerges from the further deflection mirror 121 are aligned with one another, such that once again, as already explained above in connection with FIG. 28, there is no need for a further deflection mirror between the pupil homogenizing assembly 9 and the field shaping assembly 49, that is to say the assemblies of the illumination optical unit 6 which are disposed upstream and downstream of the pupil shaping component 112.

Figure 33:
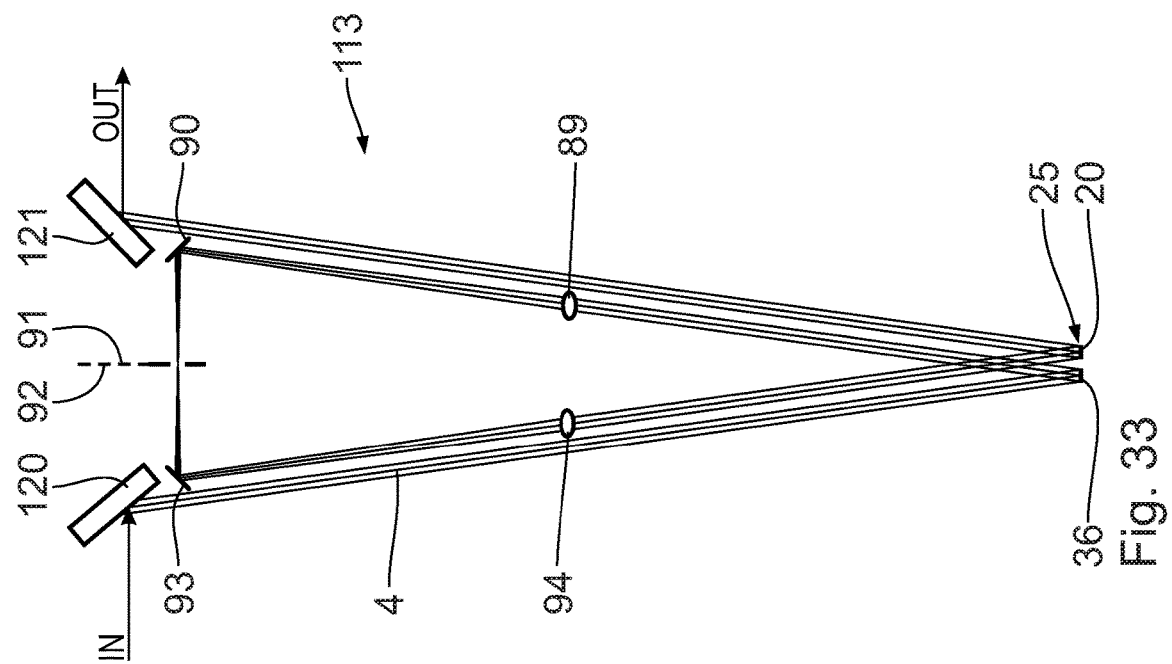

FIG. 33 correspondingly shows an input and output coupling of the illumination light 4 via the deflection mirrors 120, 121 in the case of the pupil shaping assembly 113 according to FIG. 27.

In FIGS. 28 to 33, the illumination light 4 coupled in and out is illustrated in each case by a central chief ray.

The use of angle enlarging prisms in order to resolve structural space conflicts in the case of pupil shaping assemblies in the manner of the pupil shaping assemblies 112 and 113, for example, is explained with reference to FIGS. 34 and 35. Components corresponding to those which have already been explained above with reference to FIGS. 1 to 33, particularly with reference to FIGS. 13 to 33 and very particularly with reference to FIGS. 32 and 33, bear the same reference numerals and will not be discussed in detail again.

Figure 34:
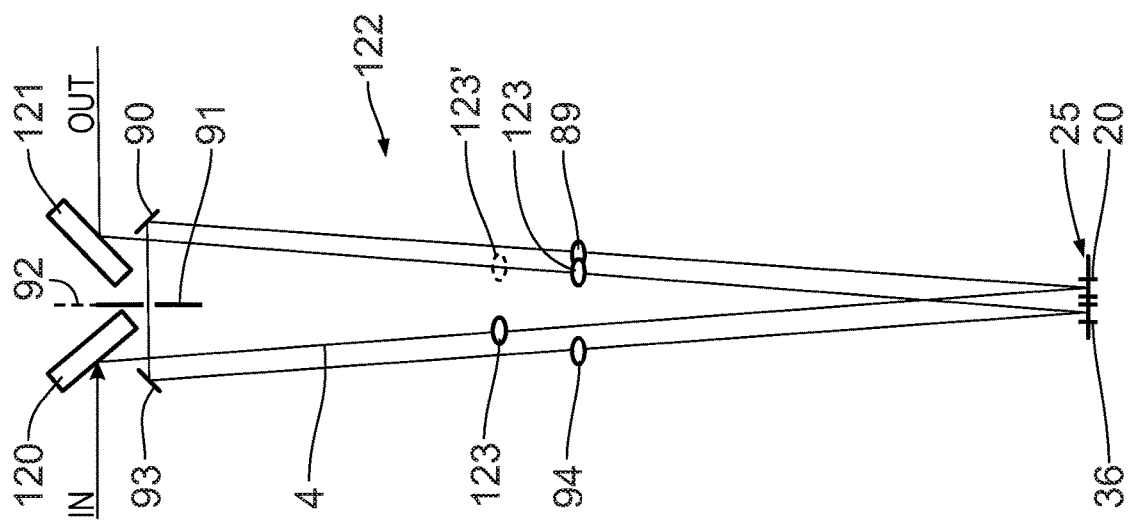

FIG. 34 shows, in the case of a pupil shaping assembly 122 in the manner of the pupil shaping assembly 112, a plurality of lenses, namely the condenser lenses 89 and 94 and, by way of example, further beam shaping lenses 123, which can be, for example, constituent parts of telescope lens pairs. In this case, one of the lenses 123 is arranged in direct proximity to the condenser lens 89.

Figure 35:
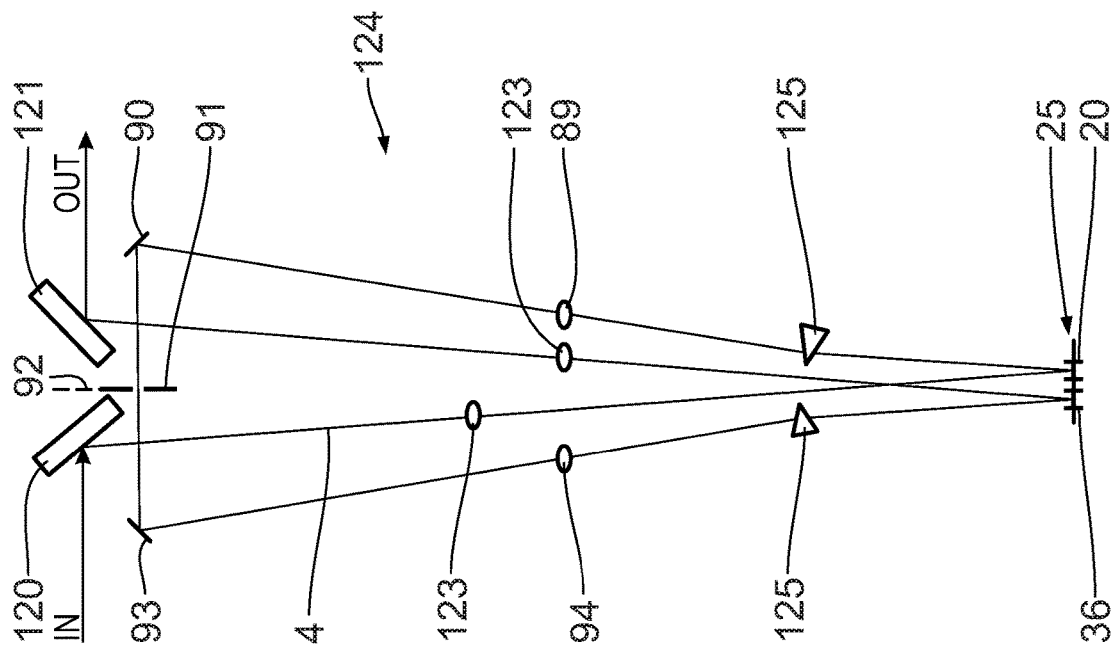
FIGS. 34 and 35 show, more highly schematically in comparison with the illustration according to FIG. 13, further embodiments of the guiding of the illumination light in further embodiments of pupil shaping assemblies.

In order to resolve possible structural space conflicts, a further pupil shaping assembly 124 according to FIG. 35, which otherwise corresponds to the pupil shaping assembly 122 according to FIG. 34, has in each case a refractive deflection prism 125 on the one hand in the partial beam path between the MMA region 20 and the deflection mirror 90 and on the other hand in the partial beam path of the illumination light between the deflection mirror 93 and the further MMA region 36. In this case, the refractive effect of the two deflection prisms 125 on these partial beams is such that a distance of the partial beams of the illumination light between the first deflection prism 125 in the beam path of the illumination light 4 and the downstream deflection mirror 90, on the one hand, and the further deflection mirror 93 and the second deflection prism 125 situated downstream thereof in the beam path of the illumination light 4, on the other hand, relative to the respectively adjacent partial beams of the illumination light 4 is increased. Correspondingly, the lenses 123 also have a larger distance relative to these two partial beams, such that structural space conflicts are avoided.

A further variant for avoiding structural space conflicts between the condenser lenses is likewise illustrated in FIG. 34, which illustrates in a dashed manner a further condenser lens 123' which can be used instead of the condenser lens 123. An optical design of the pupil shaping assembly 122 including the condenser lens 123' is such that the two condenser lenses 89, on the one hand, and 123', on the other hand, are not arranged at the same level in the adjacent beam path portions of the illumination light 4. Consequently, there is no structural space conflict between these two lenses 89 and 123'. The size of the axial offset between the lenses 89 and 123' can be chosen such that, for example, lens mounts for both lenses can be installed without structural space conflicts occurring.

In FIGS. 34 and 35, the illumination light 4 is illustrated in each case by a central chief ray.

In order to reduce an irradiance on the MMA regions, the beam of the illumination light 4 which is incident on the MMA 25 can alternatively or additionally also be shaped by the use of freeform surfaces or by the use of aspherical surfaces.

With reference to FIGS. 36 to 41, hereinafter a more detailed description is given of the operating point dependence—already explained above—of the tilting angles of the MMA regions, for example of the MMA regions 20 and 36 of the pupil shaping assembly 21 according to FIG. 1 in detail.

Figure 36:
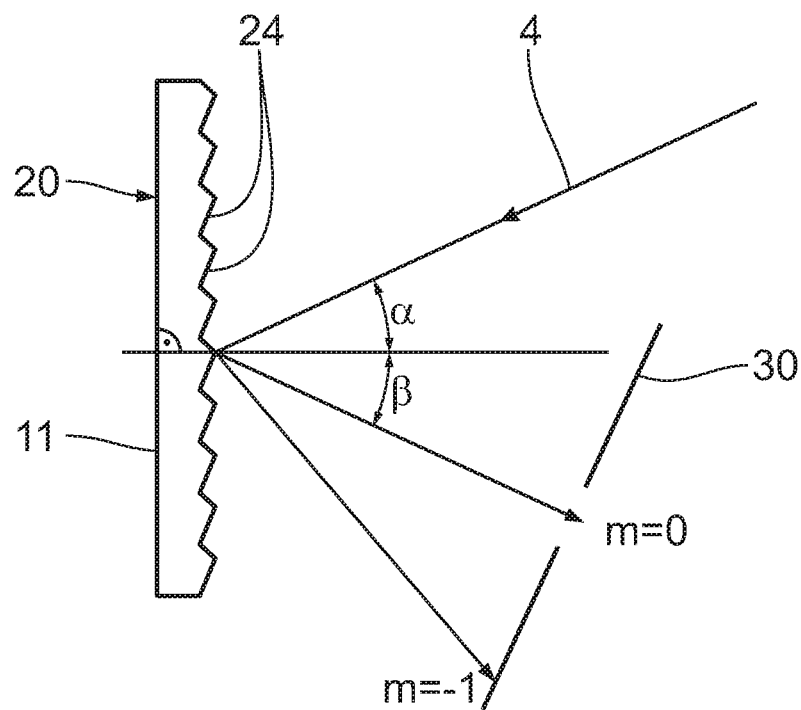
FIG. 36 shows, schematically and in an enlarged view, a section through an MMA region of one of the illustrated embodiments for clarifying variables introduced.

FIG. 36 shows one of the MMA regions, for example the MMA region 20, in a cross section. The illumination light 4, once again illustrated by a central chief ray, is incident on the MMA region at an angle of incidence which is designated by $\alpha$ in FIG. 36. A zero order of diffraction (m=0) is diffracted by the MMA region at a diffraction angle which is designated by $\beta$, in FIG. 36. The spatial filter stop 30 is also illustrated schematically in FIG. 36. A minus first order of diffraction (m=−1) is additionally shown, which is blocked by the spatial filter stop 30.

Figure 37:
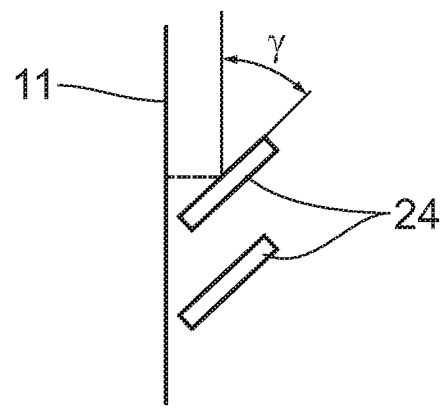
FIG. 37 shows an enlarged excerpt from FIG. 36 in the region of two adjacent micromirrors of the MMA region.

FIG. 37 shows an enlarged excerpt from FIG. 36 in the region of two adjacent micromirrors 24. These two micromirrors 24 are tilted by a tilting angle which is designated by $\gamma$ in FIG. 37. The tilting angle $\gamma$ is the angle between the micromirror principal plane 11 and a reflection plane of the respective micromirror 24.

FIG. 38 shows in a diagram the dependence of an intensity—diffracted in the direction of the zero order of diffraction by the respective MMA region—of the incident illumination light 4, plotted in percentage values of the reflection, on the tilting angle $\gamma$ of the respective micromirror 24. The following holds true: $\beta = \alpha$.

In the case of a tilting angle $\gamma = 0$, that is to say in the case of micromirrors 24 whose reflection surface is parallel to the micromirror principal plane 11, the micromirrors act as components of a blazed grating. The illumination light 4 reflected by the micromirrors having the tilting angle $\gamma = 0$ with the angle of reflection $\beta = \alpha$ simultaneously fulfills the diffraction condition of the zero order of diffraction. A reflection of 100% results.

With an increasing tilting angle $\gamma$ different from zero, the reflection firstly decreases with a small gradient and then falls more and more sharply until a minimum of the illumination light 4 reflected in the direction of the zero order of diffraction results at a tilting angle $\gamma 3$. At small tilting angles, for example in the range of tilting angles $\gamma_1$ in FIG. 3, a reflection that differs only slightly from 100% is present.

At a tilting angle $\gamma_2$, for example, a reflection of 50% of the illumination light 4 is present.

Said minimum can lie in the range of a reflection R of 0%.

Tilting angle operating points of different subregions B of the MMA regions 20 and respectively 36 are stipulated such that the product of the reflectivities for the MMA regions 20, 36 is adapted to a respectively desired illumination light intensity distribution in the pupil 34 and respectively the pupils situated downstream in the beam path of the illumination light 4, for example in the pupil plane 43.

A first operating point range can cover for example tilting angles $\gamma$ for the reflectivities between 100% and 60%, that is to say can lie in the range between $\gamma = 0$ and $\gamma = \gamma_{60}$. A second tilting angle operating point range can cover for example the reflections between 60% and 30%, that is to say can lie between the tilting angles $\gamma_{60}$ and $\gamma_{30}$. A third tilting angle operating point range can cover for example the reflections between 30% and 0% and can lie between the tilting angles $\gamma_{30}$ and $\gamma_3$. The tilting angle $\gamma_{60}$ (cf. FIG. 38) lies between the tilting angles $\gamma_1$ and $\gamma_2$. The tilting angle $\gamma_{30}$ lies between the tilting angles $\gamma_2$ and $\gamma_3$.

The generation of an exemplary illumination light intensity distribution in the pupil 34 and in the downstream pupil planes of the beam path of the illumination light 4 is explained below with reference to FIGS. 39 to 41.

The first MMA region has, in a first MMA subregion B1, micromirrors 24 whose tilting angles are set to the tilting angle $\gamma 2$ in the tilting angle operating point range between the tilting angles $\gamma_{60}$ and $\gamma_{30}$. This micromirror subrange therefore reflects the illumination light 4 into the diffraction angle of the zero order of diffraction with a reflection of 50%.

The micromirrors 24 in a further micromirror subregion B2 of the MMA region 20 are set to the tilting angle $\gamma_1$, that is to say have a tilting angle in the operating point range between $\gamma = 0$ and $\gamma_{60}$. This results in a reflection for the illumination light 4 reflected at the micromirror subregion B2 of the MMA region 20 in the region of about 100%.

The micromirror subregion B1 constitutes, for example, a pole of an x-dipole illumination setting. The micromirror subregion B2 constitutes a circular central region of the MMA region 20.

Outside the micromirror subregions B1, B2, the micromirrors 24 are set at the tilting angle $\gamma_3$, which lies above the tilting angle $\gamma_{30}$ in the tilting angle operating point range. Outside the micromirror subregions B1, B2 of the MMA region 20, therefore, the illumination light 4 is practically not reflected in the direction of the zero order of diffraction.

In the second MMA region 36, the micromirrors 24 once again in the MMA subregion B1, the size and position of which correspond to those of the micromirror subregion B1 of the first MMA region 20, are set to a tilting angle $\gamma_1$ in the tilting angle operating point range between the tilting angles $\gamma=0$ and $\gamma_{60}$. All the other micromirrors of the second MMA region 36 are set in the same way as those of the first MMA region 20.

An intensity distribution of the illumination light 4 over the illumination pupil 34 after reflection at the two MMA regions 20, 36 results as the product of the reflections of the two MMA regions 20 and 36 according to FIGS. 39 and 40. This product is illustrated in FIG. 41. In the pole region B1 of the pupil, which pole region is impinged on as a result of reflection at the micromirrors 24 of the MMA subregions B1, a total reflection of 50% is present as the product of the reflections at the MMA regions 20 and 36. In the central region B2 of the pupil 34, which central region in turn corresponds to the MMA subregions B2 of the MMA regions 20, 36, a reflection product of approximately 100% is present. Everywhere else on the pupil 34 the result is a reflection product of two reflectivities in the region of 0%, that is to say, with a correspondingly higher suppression ratio, a reflection of 0%.

A number of implementations have been described. Nevertheless, it will be understood that various modifications may be made. For example, elements of one or more implementations may be combined, deleted, modified, or supplemented to form further implementations. In addition, other components may be added to, or removed from, the described illumination optical unit. Accordingly, other implementations are within the scope of the following claims.

What is claimed is:

1. An illumination optical unit for illuminating objects to be examined by a metrology system with illumination light, comprising:
    an optical pupil influencing assembly configured to influence an intensity distribution of the illumination light over a pupil of the illumination optical unit,
    wherein the pupil influencing assembly is designed such that the illumination light impinges on at least one region of a micromirror array a first time, is reflected from the at least one region of the micromirror array, and the light reflected from the at least one region is subsequently redirected back toward the at least one region of the micromirror array, and impinges on the at least one region of the micromirror array at least a second time in the beam path of the illumination light.

2. The illumination optical unit according to claim 1, wherein the pupil influencing assembly comprises at least two micromirror array regions which are separated from one another and are arranged one after another in the beam path of the illumination light.

3. The illumination optical unit according to claim 1, wherein the at least one micromirror array for pupil shaping comprises a diffraction-reflection grating for the illumination light.

4. The illumination optical unit according to claim 1, wherein the beam path of the illumination light onto the at least one micromirror array is configured in such a way that the illumination light is incident on micromirrors of the micromirror array with an input divergence which is less than a diffraction angle of a first order of diffraction of the diffraction-reflection grating formed by the micromirror array.

5. The illumination optical unit according to claim 1, wherein the micromirror array comprises micromirrors which are configured to be adjustable continuously within a tilting angle range.

6. The illumination optical unit according to claim 5, wherein the beam path of the illumination light onto the at least one micromirror array and the at least one micromirror array are configured in such a way
    that the illumination light upon a first micromirror impingement is reflected by micromirrors of the micromirror array whose tilting angle driving is effected in a first tilting angle operating point range,
    that the illumination light upon a second micromirror impingement is reflected by micromirrors of the micromirror array whose tilting angle driving is effected in a second tilting angle operating point range,
    wherein the first tilting angle operating point range differs from the second tilting angle operating point range.

7. The illumination optical unit according to claim 6, wherein the beam path of the illumination light onto the at least one micromirror array is configured in such a way
    that the illumination light upon a first micromirror impingement is reflected with a first reflectivity range by micromirrors of the micromirror array,
    that the illumination light upon a second micromirror impingement is reflected with at least one second reflectivity range by micromirrors of the micromirror array,
    wherein the first reflectivity range differs from the second reflectivity range.

8. The illumination optical unit according to claim 7, wherein at least one of the reflectivity ranges covers a reflectivity in the range of between 30% and 60%.

9. The illumination optical unit of claim 1 in which the illumination light passes through a filter stop after the illumination light is directed away from the at least one region of the micromirror array, but before the illumination light is subsequently redirected toward the at least one region of the micromirror array.

10. The illumination optical unit of claim 9 in which the filter stop is configured to select a zero order of diffraction of the illumination light.

11. The illumination optical unit of claim 1 in which the illumination light impinges on a first region of the micromirror array at the first time and impinges on a second region of the micromirror array at the at least the second time, and the first region overlaps the second region.

12. The illumination optical unit of claim 1 in which the illumination light impinges on a first region of the micromirror array at the first time and impinges on a second region of the micromirror array at the at least the second time, and the first region does not overlap the second region.

13. An illumination optical unit for illuminating objects to be examined by a metrology system with illumination light, comprising:
    an optical pupil influencing assembly for influencing an intensity distribution of the illumination light over a pupil of the illumination optical unit,
    wherein the pupil influencing assembly comprises at least one micromirror array,
    wherein the at least one micromirror array for pupil influencing comprises a diffraction-reflection grating for the illumination light, wherein the at least one micromirror array is configured to be driven in such a way that it is operated in the at least second used order of diffraction for the illumination light, and a downstream spatial filter stop arranged in a beam path downstream of the at least one micromirror array is arranged in a direction that corresponds to a diffraction direction of the second or higher used order of diffraction.

14. The illumination optical unit of claim 13 in which the at least one micromirror array for pupil shaping comprises a diffraction-reflection grating for the illumination light.

15. The illumination optical unit of claim 13 in which the micromirror array comprises micromirrors that are configured to be adjustable continuously within a tilting angle range.

16. An illumination optical unit for illuminating objects to be examined by a metrology system with illumination light, comprising:
- an optical pupil influencing assembly for influencing an intensity distribution of the illumination light over a pupil of the illumination optical unit,
- wherein the pupil influencing assembly comprises at least one micromirror array,
- wherein illumination light impinges on a first used region of the at least one micromirror array, is reflect from the first used region of the at least one micromirror array, and the light reflected from the first used region is subsequently redirected toward at least a second used region of the at least one micromirror array, and the first used region and the at least the second used region are arranged in a manner spatially separated from one another,
- wherein at least one micromirror array region on which illumination light does not impinge is arranged between two neighboring used micromirror array regions from among the used micromirror array regions arranged in a manner spatially separated from one another.

17. The illumination optical unit according to claim 16, wherein the at least one micromirror array region on which illumination light does not impinge comprises an exchange micromirror array region, wherein the beam path of the illumination light is configured such that it is displaceable relative to the at least one micromirror array to enable a change of an illumination light impingement between at least one used micromirror array region and at least one assigned exchange micromirror array region to be carried out.

18. The illumination optical unit of claim 16 in which the illumination light passes through a filter stop after the illumination light is directed away from the first used region of the at least one micromirror array, but before the illumination light is redirected toward the at least the second used region of the at least one micromirror array.

19. The illumination optical unit of claim 18 in which the filter stop is configured to select a zero order of diffraction of the illumination light.

20. The illumination optical unit of claim 16 in which the beam path of the illumination light onto the at least one micromirror array are configured in such a way
- that the illumination light upon a first micromirror impingement is reflected by micromirrors of the first used region of the micromirror array whose tilting angle driving is effected in a first tilting angle operating point range,
- that the illumination light upon a second micromirror impingement is reflected by micromirrors of the at least the second used region of the micromirror array whose tilting angle driving is effected in a second tilting angle operating point range, wherein the first tilting angle operating point range differs from the second tilting angle operating point range.

* * * * *

UNITED STATES PATENT AND TRADEMARK OFFICE
CERTIFICATE OF CORRECTION

PATENT NO.         : 10,578,881 B2
APPLICATION NO.    : 16/220212
DATED              : March 3, 2020
INVENTOR(S)        : Thomas Frank et al.

It is certified that error appears in the above-identified patent and that said Letters Patent is hereby corrected as shown below:

In the Specification

Column 25
Line 56, delete "a" and insert -- α --
Line 58, delete "β," and insert -- β --

Signed and Sealed this
Ninth Day of June, 2020

Andrei Iancu
*Director of the United States Patent and Trademark Office*